(12) United States Patent
Leung

(10) Patent No.: US 7,493,505 B2
(45) Date of Patent: Feb. 17, 2009

(54) MCU WITH LOW POWER MODE OF OPERATION

(75) Inventor: Ka Y. Leung, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 315 days.

(21) Appl. No.: 11/301,579

(22) Filed: Dec. 13, 2005

(65) Prior Publication Data
US 2007/0168681 A1    Jul. 19, 2007

(51) Int. Cl.
*G06F 1/32* (2006.01)
(52) U.S. Cl. .................... 713/323; 713/324; 327/530
(58) Field of Classification Search ............... 713/320, 713/323, 324; 327/530
See application file for complete search history.

(56) References Cited

U.S. PATENT DOCUMENTS

| | | | | |
|---|---|---|---|---|
| 6,848,055 | B1* | 1/2005 | Yarch | 713/300 |
| 6,927,619 | B1* | 8/2005 | Doyle | 327/534 |
| 7,031,219 | B2* | 4/2006 | Hsu et al. | 365/226 |
| 7,110,317 | B2* | 9/2006 | Song et al. | 365/226 |
| 2004/0090820 | A1* | 5/2004 | Pathak et al. | 365/154 |
| 2004/0119453 | A1* | 6/2004 | Clark et al. | 323/283 |

* cited by examiner

*Primary Examiner*—Thuan N Du
(74) *Attorney, Agent, or Firm*—Howison & Arnott, L.L.P.

(57) ABSTRACT

A low power system is disclosed for working in conjunction with a digital circuit that is disposed between positive and negative terminals. The system includes an internal voltage generator for increasing, for at least a first portion of the digital circuit, a voltage difference between the at least a first portion of the digital circuit and the voltage on at least one of the positive and negative terminals during a low power mode of operation. This allows the voltage across the at least first portion of the digital circuit to be less than the full voltage across the positive and negative terminals.

11 Claims, 13 Drawing Sheets

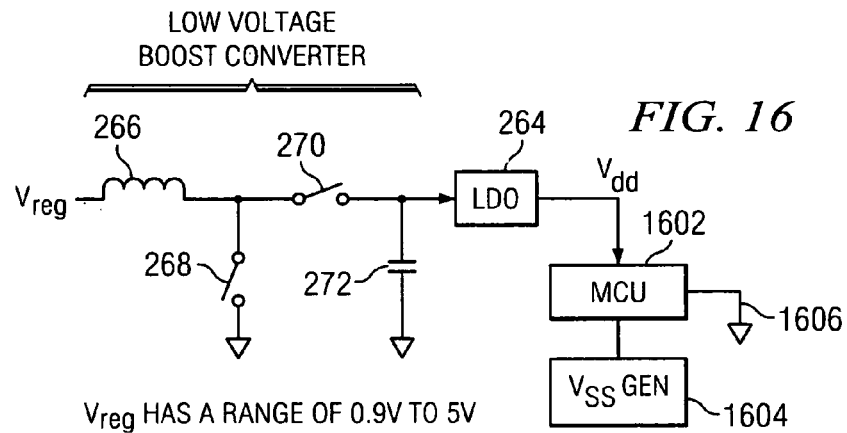
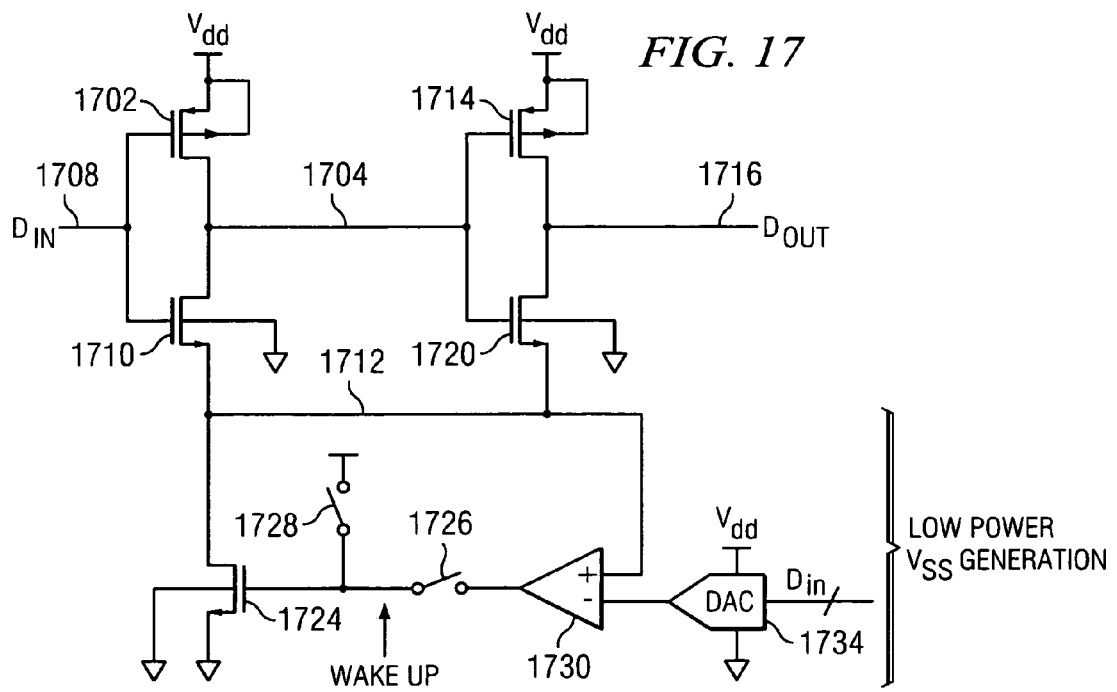

MCU WITH LOW POWER MODE OF OPERATION

TECHNICAL FIELD OF THE INVENTION

The present invention pertains in general to microcontroller units (MCUS) and, more particularly, to the power control aspects thereof when placed in a sleep mode of operation.

CROSS-REFERENCE TO RELATED APPLICATIONS

N/A

BACKGROUND OF THE INVENTION

Microcontroller units (MCU) provide a processor based mixed-signal application integrated circuit that is typically referred to as a system on a chip (SOC). Typically, a processor is provided of the 8051 type, a conventional processor, with memory such as Flash. Data converters are provided for interfacing with the analog domain so as to allow analog data to be collected from various types of sensors. There are also provided various oscillators and the such on the integrated circuit. These SOC integrated circuits are typically directed toward instrumentation type applications that requires interface with sensors and the such, and which can provide some processing of the information from these sensors in a digital domain.

In some applications of MCU based SOCs, there is a requirement for a low power mode of operation. For example, when these devices are associated with implanted apparatus, such as knee joints, there is a desire that the battery last as long as possible. Although there are techniques for charging batteries external to the human body, it is still desirable to minimize the size of the battery if possible. Thus, these SOCs have what is termed a "sleep mode" associated therewith. The sleep mode allows the SOC to be placed in a very low power mode of operation wherein substantially all operations are suspended or halted to conserve power.

There are a number of ways to implement the sleep mode of operation. The first is a complete power down of the chip wherein the configuration information and the such can be stored in the on-chip memory prior to power down. This is the lowest power mode of operation, since there is virtually no current drawn when the chip is powered down. However, this mode of operation is required to store all state information of the CPU and, when it is again powered up, it must reload the stored information such that the logic states at power down can be recovered. A second mode that is implemented is that associated with suspending the clock. When the clock is suspended, the digital portion of the integrated circuit is maintained at the last known state for all transistors. Therefore, when one inverter circuit has a "1" on the input thereof, the output thereof will have a "0" on the output and this will remain fixed until the sleep mode is terminated. This reduces power, as nodes are not being toggled between logic states, which draw current. However, in this mode of operation, there is still some inherent leakage associated with the transistors. For example, even though an N-channel transistor is turned off due to the fact that the gate voltage is disposed at a voltage equal to or lower than the source voltage, there is still the possibility for some "sub-threshold conduction." This is the condition that, even though the transistor is operating below its threshold voltage, the transistor can still conduct. As the dimensions of the transistors are reduced with advancing technology, this leakage current increases. Thus, even though the clock is suspended, there is still the possibility of a not insignificant current draw occurring due to the leakage through the transistors that are turned off.

SUMMARY OF THE INVENTION

The present invention disclosed herein comprises, in one aspect thereof, a low power system for working in conjunction with a digital circuit that is disposed between positive and negative terminals. The system includes an internal voltage generator for increasing, for at least a first portion of the digital circuit, a voltage difference between the at least a first portion of the digital circuit and the voltage on at least one of the positive and negative terminals during a low power mode of operation. This allows the voltage across the at least first portion of the digital circuit to be less than the full voltage across the positive and negative terminals.

BRIEF DESCRIPTION OF THE DRAWINGS

For a more complete understanding of the present invention and the advantages thereof, reference is now made to the following description taken in conjunction with the accompanying Drawings in which:

FIG. 16 illustrates a diagrammatic view of the MCU and a low voltage boost converter configuration;

FIG. 17 illustrates a schematic diagram of the low powered $V_{ss}$ generator;

DETAILED DESCRIPTION OF THE INVENTION

Figure 1:
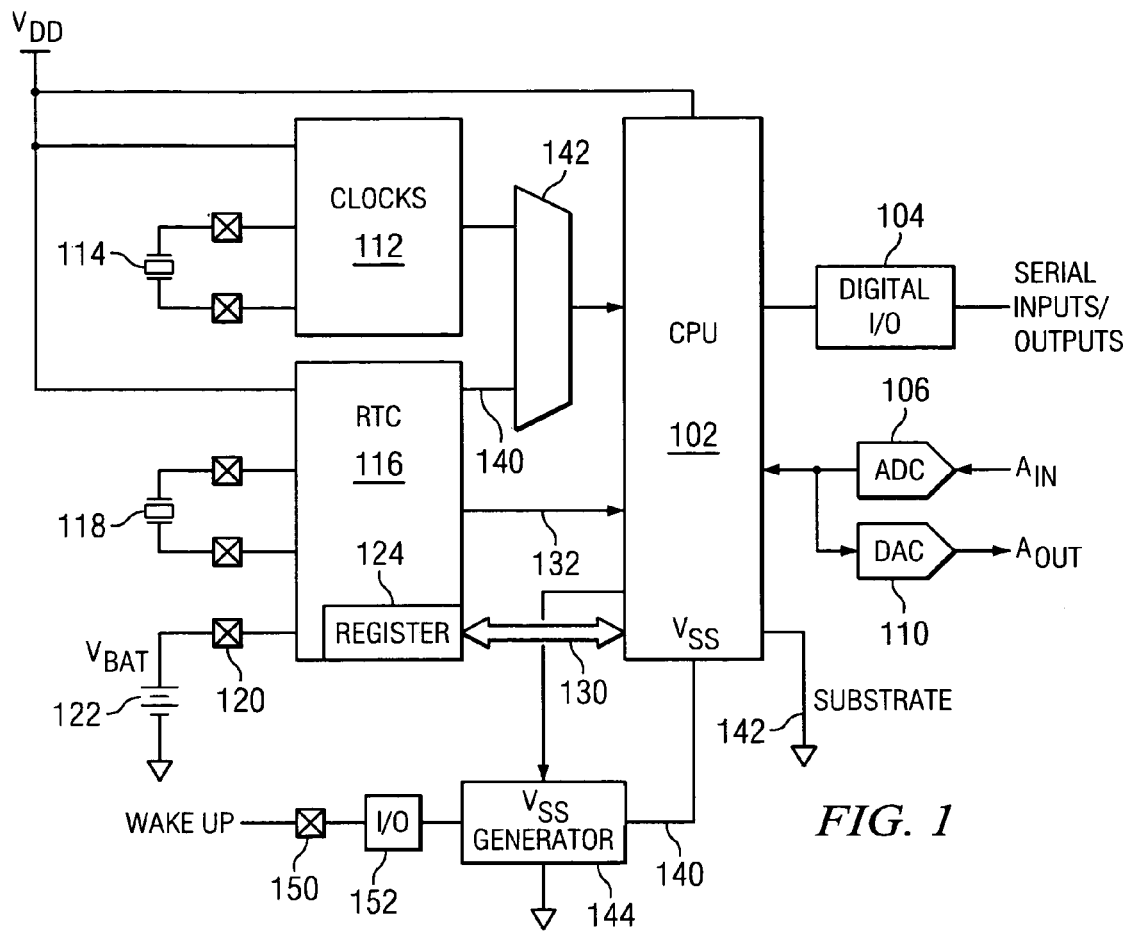
FIG. 1 illustrates an overall diagram view of an MCU with a separate low power real time clock (RTC)

Referring now to FIG. 1, there is illustrated a block diagram of a processor-based system that drives the mixed signal technologies that include as a part thereof, a digital section including a central processing unit (CPU) 102 and a digital I/O section 104 that is operable to interface with various serial inputs and outputs. The system also includes the analog section which provides for an analog-to-digital converter (ADC) 106 that is operable to receive one or more analog inputs and also provides a digital-to-analog converter (DAC) 110 for allowing digital information from the CPU 102 to be converted to analog output information. The operation of the CPU 102 is controlled by various clocks 112 in a primary oscillator section. These are the operational clocks that control the overall operation of the MCU. In one mode, they will be interfaced with a crystal 114 for precision operation thereof. However, as will be described herein below, a precision internal non-crystal based clock can be utilized and, further, there can be a high frequency crystal and a low frequency crystal for two different operational modes. Normally, the output of the block 112 provides the operating clock with the CPU 102.

There is also provided a separate stand alone real time clock (RTC) block 116. This clock 116 operates on a separate RTC crystal 118 that provides the time base therefor. The RTC 116 interfaces with the chip supply voltage $V_{DD}$, which also drives CPU 102 and the clock block 112. The RTC block 116 also interfaces with a battery terminal 120 and an external back-up battery 122. The RTC 116 has disposed thereon a plurality of registers and RAM memory 124, which are operable to store the timing information associated with the RTC 116. The RTC 116 operates independently with the primary purpose being to maintain current time and date information therein separate and independent of the operation of the digital and analog sections and the power required thereby or provided thereto. This information can be initialized by the CPU 102 through a digital interface 130 with the registers 124. During operation, the RTC 116 will update its internal time and date information, which information is stored in the registers 124. The RTC 116 is operable to generate an interrupt on an interrupt line 132 (to the CPU 102). Therefore, the RTC 116 can interface with the CPU 102 in order to generate an interrupt thereto. As will be described herein below, this interrupt facilitates waking the CPU 102 up when it is placed into an inactive or deep sleep mode. However, the CPU 102 at any time can query the register 124 for information stored therein. The RTC 116, as will also be described herein below, is a very low power circuit that draws very little current, the current less than 1.0 μA. The RTC 116 provides a clock output on a line 140 to a clock multiplexer 142. The multiplexer 142 also receives the output of the clock circuit 112, the output of the multiplexer providing the system clock to the CPU 102. The clock circuit 112 is operable to generate a base frequency of around 25 MHz that can be multiplied or divided. However, the base operating frequency of the RTC 116 of around 32 kHz can provide an alternate low frequency time base for the system clock. This will allow the CPU 102 to operate at a low frequency for power conservation purposes.

The operation of the processor-based system has a mode that allows it to operate in a very low power condition. In this condition, the digital circuitry has the operation thereof suspended. The first step of the suspension is to terminate the operation of the clocks 112 such that the CPU 102 is no longer operable to change internal logic states thereto, i.e., the internal gates thereof are not "toggled." In this state, all nodes will be maintained at either a logic "1" or a logic "0." As such, the current will be minimized, except for leakage current, which can be a problem. To account for this, the digital circuitry, the CPU 102 in this illustration, has the $V_{ss}$ terminal separated from ground, but the substrate is connected to ground through a substrate terminal 142. The $V_{ss}$ is interfaced with a terminal 140 and this has the voltage thereof controlled by a $V_{ss}$ generator 144. The $V_{ss}$ generator 144 is operable to generate a voltage that is either ground during normal operation or above ground, for reasons described herein below. The $V_{ss}$ generator 144 is configured by the CPU 102 in order to define the voltage level that will be placed on $V_{ss}$ during the low power mode of operation. When the low power mode of operation is entered, the CPU 102 can actively initiate the operation of the $V_{ss}$ generator 144 to raise the voltage on terminal 140 above ground, or this can be in response to an external signal. The external signal can either actively place it into the low power mode of operation, but more specifically, it is utilized to wake the part up. This wake up signal is input on a terminal 150 and interfaced to the $V_{ss}$ generator 140 through an I/O port 152.

Figure 2A:
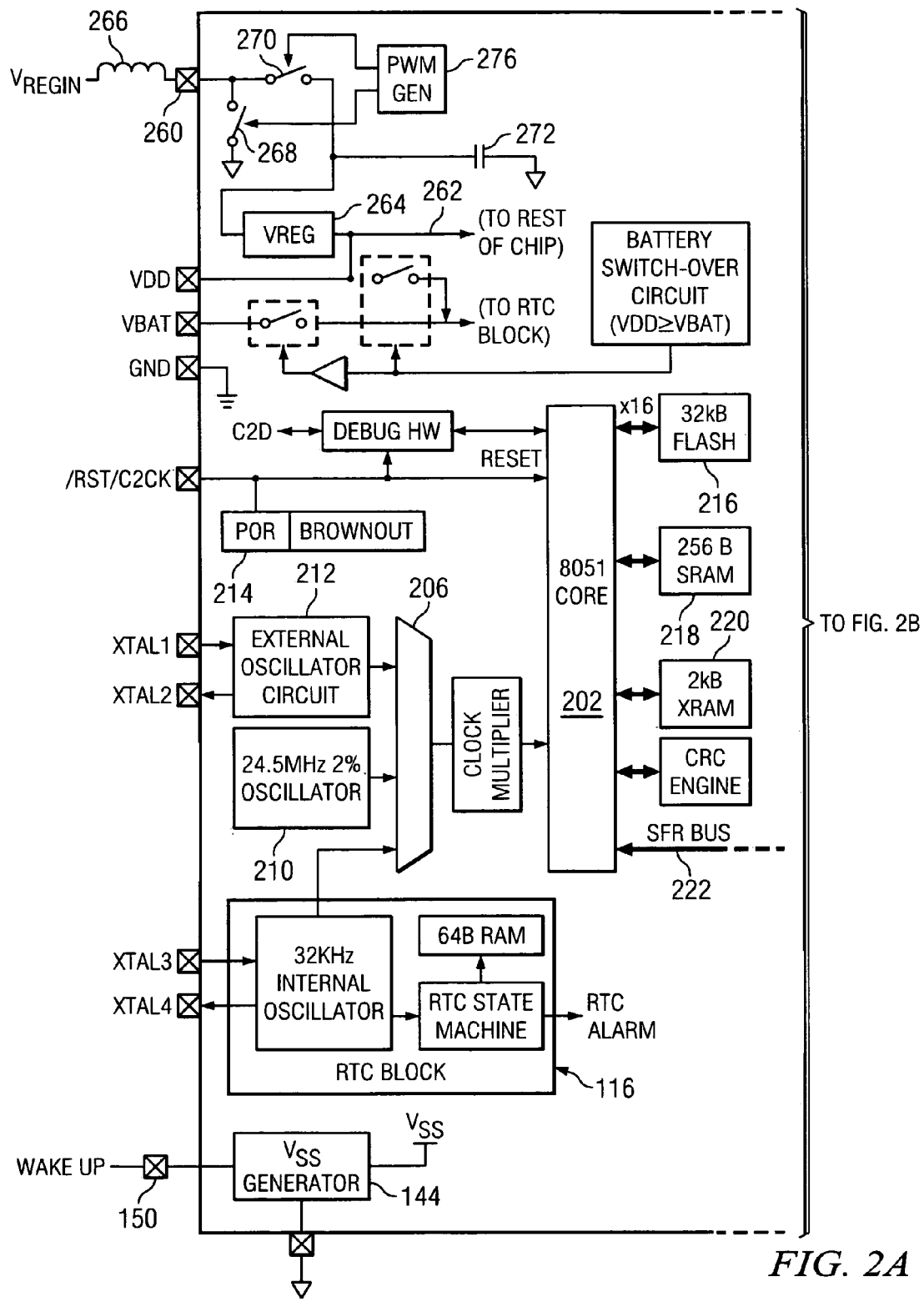
FIG. 2 illustrates an overall block diagram of the MCU chip showing the various functional blocks thereof.
Figure 2B:
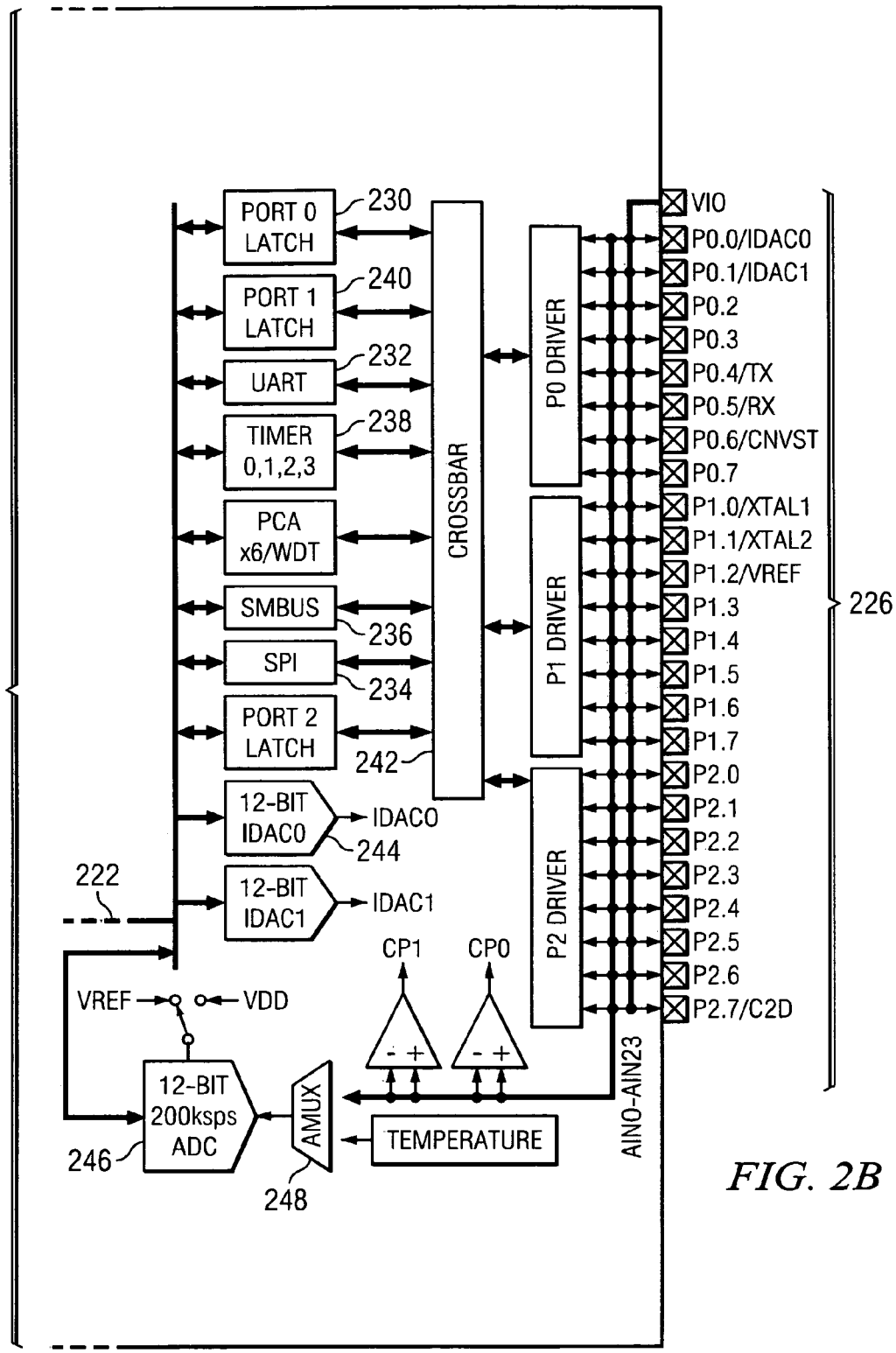

Referring now to FIG. 2, there is illustrated a block diagram of the MCU. As noted herein above, the MCU is generally of the type similar to part number C8051F330/1 manufactured by Silicon Laboratories Inc., with the exception of the addition of the RTC 116. The MCU includes in the center thereof a processing core 202 which is typically comprised of a conventional microprocessor of the type "8051." The processing core 402 receives a clock signal on a line 204 from a multiplexer 206. The multiplexer 206 is operable to select among multiple clocks. There is provided an 80 kHz internal oscillator 208, a 24.5 MHz trimmable internal precision oscillator 212 or an external crystal controlled oscillator 210. The precision internal oscillator 212 is described in U.S. patent application Ser. No. 10/244,344, entitled "PRECISION OSCILLATOR FOR AN ASYNCHRONOUS TRANSMISSION SYSTEM," filed Sep. 16, 2002, which is incorporated herein by reference. The processing core 202 is also operable to receive an external reset on terminal 213 or is operable to receive the reset signal from a power-on-reset block 214, all of which provide a reset to processing core 202. The processing core 202 has associated therewith a plurality of memory resources, those being either flash memory 216, SRAM memory 218 or random access memory 220. The processing core 202 interfaces with various digital circuitry through an on-board digital bus 222 which allows the processing core 202 to interface with various operating pins 226 that can interface external to the chip to receive digital values, output digital values, receive analog values or output analog values. Various digital I/O circuitry are provided, these being latch circuitry 230, serial port interface circuitry, such as a UART 232, an SPI circuit 234 or an SMBus interface circuit 236. Three timers 238 are provided in addition to another latch circuit 240. All of this circuitry 230-240 is interfaceable to the output pins 226 through a crossbar device 242, which is operable to configurably interface these devices with select ones of the outputs. The digital input/outputs can also be interfaced to a digital-to-analog converter 244 for allowing a digital output to be converted to an analog output, or to the digital output of an analog-to-digital converter 246 that receives analog input signals from an analog multiplexer 248 interfaced to a plurality of the input pins on the integrated circuit. The analog multiplexer 248 allows for multiple outputs to be sensed through the pins 226 such that the ADC can be interfaced to various sensors. Again, the MCU 102 is a conventional circuit.

The $V_{ss}$ generator 144 is illustrated as being disposed in proximate relationship to the digital circuitry. As will be described herein below, the RTC block 116 is operable to operate in a fully functional mode in the low power mode. Therefore, any circuitry associated therewith, whether it be analog or digital, it will not be placed in a full power mode and, therefore, will not have the ground reference thereof or the $V_{ss}$ thereof removed from ground during low power mode. Therefore, the $V_{ss}$ generator 144 will not be functionally associated with this particular block. Additionally, there are a few other circuits on the integrated circuit that may not be affected by such. However, the primary purpose for the $V_{ss}$ generator 144 is to be associated with the primary processing circuitry of the CPU and its internal states. The purpose of the $V_{ss}$ generator 144 is to allow sufficient voltage to be disposed across the digital circuitry such that the internal states thereof are "preserved" during the low power mode of operation. It is not necessary for the digital circuitry to be operational such that it can execute instructions during a low power mode, but that is not necessarily prohibited. As such, the instructions could be carried out to some extent, albeit they will not be carried out at the specified frequency, etc. Further, there are certain functional blocks, such as the ADC 246, the multiplexer 248, etc., that can have the operations thereof controlled by the $V_{ss}$ generator 144. However, the $V_{ss}$ generator 144 need only control the predominant digital processing circuitry, such as that associated with the 8051 core 202. The purpose of this is to "preserve" the logic states therein such that, when the chip is low, it can resume processing at the states that existed at the time that the chip was placed into the low power mode of operation. The blocks 246 and 248 and most of the peripheral circuitry occupies a very small portion of the overall circuitry and transistor gates on the chip. Therefore, since the predominant portion of the leakage current exists within the digital processing core 202, it is the voltage across this core that is reduced during the low power mode of operation. The remaining circuitry can remain powered or can even be turned off, since it is not necessary to preserve the states end blocks such as the ADC 246 and the multiplexer 248. Further, there are some configuration registers that configure the type of driver output that is provided such as whether it is an analog output, digital output or digital input. These states would also be desirable to preserve. Therefore, any state that is required for the normal operation of the integrated circuit prior to going to a low power mode of operation would be controlled by the $V_{ss}$ generator 144 during the low power mode of operation if that state is necessary when the chip is woken up.

The power to the integrated circuit is provided to a terminal 260, which is normally input through an on-chip regulator 264 to a node 262 to provide power to the rest of the chip. However, there are provided a set of switches such that a low voltage boost converter can be accommodated to allow a lower voltage input to be "boosted" up to a higher voltage level. By placing these switches on-chip and controlling them with an on-chip controller, all that is required is an external inductor 266 placed in series with an input voltage $V_{REGIN}$ that is input to the node 260. A first switch 268 is connected between the terminal 260 and ground and the second switch 270 is connected in series between the terminal 260 and the input to the regulator 264. The regulator 264 provides the filtering of ripple. There is also provided a capacitor 272 on the regulator side of the switch 270. Again, the regulator 264 is operable to handle the ripple from the power supply. An on-chip pulse width modulation (PWM) generator 276 is provided to generate such control signals to the switch 268 and to the switch 270. This is a conventional PWM generator 276 for a boost converter. If the boost converter is not utilized, switch 268 is opened and switch 270 is closed.

Figure 3:
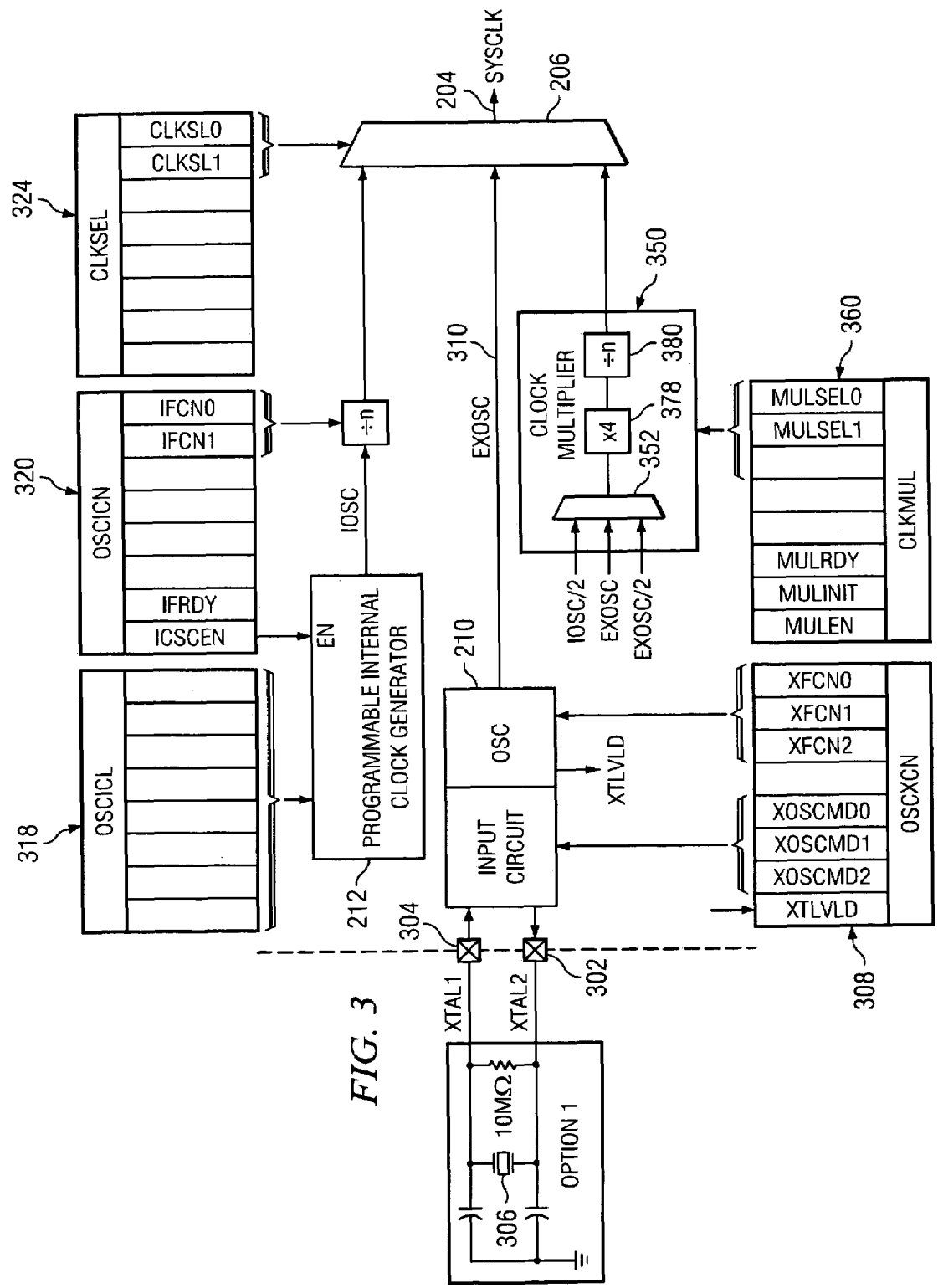
FIG. 3 illustrates a block diagram of the oscillators utilized for the processing operation of the MCU.

Referring now to FIG. 3, there is illustrated a schematic diagram of the primary oscillator section comprised of the oscillators 210 and 212 and the multiplexer 206. The oscillator 210 is a crystal controlled oscillator that is interfaced through two external terminals 302 and 304 to an external crystal 306 and operates up to frequencies in excess of 25 MHz. A register 308 is provided, labeled OSCXCN, which is operable to drive control signals for the oscillator 210 and to record output values thereof. The output of the oscillator 210 is provided on a line 310 to one input of the multiplexer 206. The programmable precision trimmable oscillator 212 is controlled by a register 318 and a register 320 to control the operation thereof, i.e., to both set the frequency thereof and to enable this oscillator. The output of the oscillator 212 is processed through a divide circuit 330, the divide ratio thereof set by bits in the register 320 to provide on an output 322 a precision high frequency clock to another input of the multiplexer 206. The output of the multiplexer 206 is provided to the MCU 102 on the clock line 404 as a system clock signal SYSCLK. The clock select operation is facilitated with a register 324 labeled CLKSEL, which controls the multiplexer 206.

The programmable high frequency oscillator 212 is the default clock for system operation after a system reset. The values in the register 318, labeled OSCICL, provide bits that are typically programmed at the factory, these bits stored in the flash memory. The center frequency of the high frequency clock is 24.5 MHz. The divide circuit 330 can provide a divide ratio of one, two, four or eight. The oscillator 212, in the C8051F330 device by way of example only, is a ±2 percent accuracy oscillator which has a center frequency that, although programmed at the factory, is allowed to be adjusted by changing the bits in the register 318. There are provided seven bits in the register 318 that are calibratable bits. The register 320 provides an enable bit for the oscillator 212 and a bit that determines if the oscillator 212 is running at the programmed frequency. Two bits in the register 320 are utilized to set the divide ratio of the divider 330.

There is also provided a clock multiplier circuit 350, which is comprised of a multiplexer 352 for selecting the output of the clock circuits 210, the internal clock 212 or the clock 210 divided by a factor of 2 and providing the selected clock to a 4× multiplier 378. This multiplied clock is then input to a fractional divide block 380, the output thereof selected by the multiplexer 206. This block 350 is controlled by a select register 360. The select register operates in accordance with the following table:

TABLE 1

| CLKMUL: Clock Multiplier Control Register | | | | | | | |
|---|---|---|---|---|---|---|---|
| R/W | R/W | R | R/W | R/W | R/W | R/W | R/W |
| MULEN | MULINIT | MULRDY | | MULDIV | | | MULSEL |
| Bit7 | Bit6 | Bit5 | Bit4 | Bit3 | Bit2 | Bit1 | Bit0 |

Bit7: MULEN: Clock Multiplier Enable
 0: Clock Multiplier disabled.
 1: Clock Multiplier enabled.
Bit6: MULINIT: Clock Multiplier Initialize
 This bit should be a '0' when the Clock Multiplier is enabled.
 Once enabled, writing a '1' to this bit will initialize the
 Clock Multiplier. The MULRDY bit reads '1' when the Clock
 Multiplier is stabilized.

TABLE 1-continued

Bit5:   MULRDY: Clock Multiplier Ready
        This read-only bit indicates the status of the Clock Multiplier.
        0: Clock Multiplier not ready.
        1: Clock Multiplier ready (locked).
Bits4-2:  MULDIV: Clock Multiplier Output Scaling Factor
        These bits scale the Clock Multiplier output.
        000: Clock Multiplier Output scaled by a factor of 1.
        001: Clock Multiplier Output scaled by a factor of 1.
        010: Clock Multiplier Output scaled by a factor of 1.
        011: Clock Multiplier Output scaled by a factor of $2/3$.
        100: Clock Multiplier Output scaled by a factor of $2/4$ (or $1/2$).
        101: Clock Multiplier Output scaled by a factor of $2/5$.
        110: Clock Multiplier Output scaled by a factor of $2/6$ (or $1/3$).
        111: Clock Multiplier Output scaled by a factor of $2/7$.
Bits1-0:  MULSEL: Clock Multiplier Input Select These bits select the clock supplied to the Clock Multiplier.

| MULSEL | Selected Input Clock | Clock Multiplier Output for MULDIV = 000b |
| --- | --- | --- |
| 0 | Internal Oscillator/2 | Internal Oscillator × 2 |
| 1 | External Oscillator | External Oscillator × 4 |
| 10 | External Oscillator/2 | External Oscillator × 2 |
| 11 | Internal Oscillator | Internal Oscillator × 4 |

It can be seen that bits 4-2 set the divide ratio for the fractional divide circuit. For values "000," "001" and "010," there will be no fractional divide. For the remaining values, there will be a non integer divide.

Figure 4:
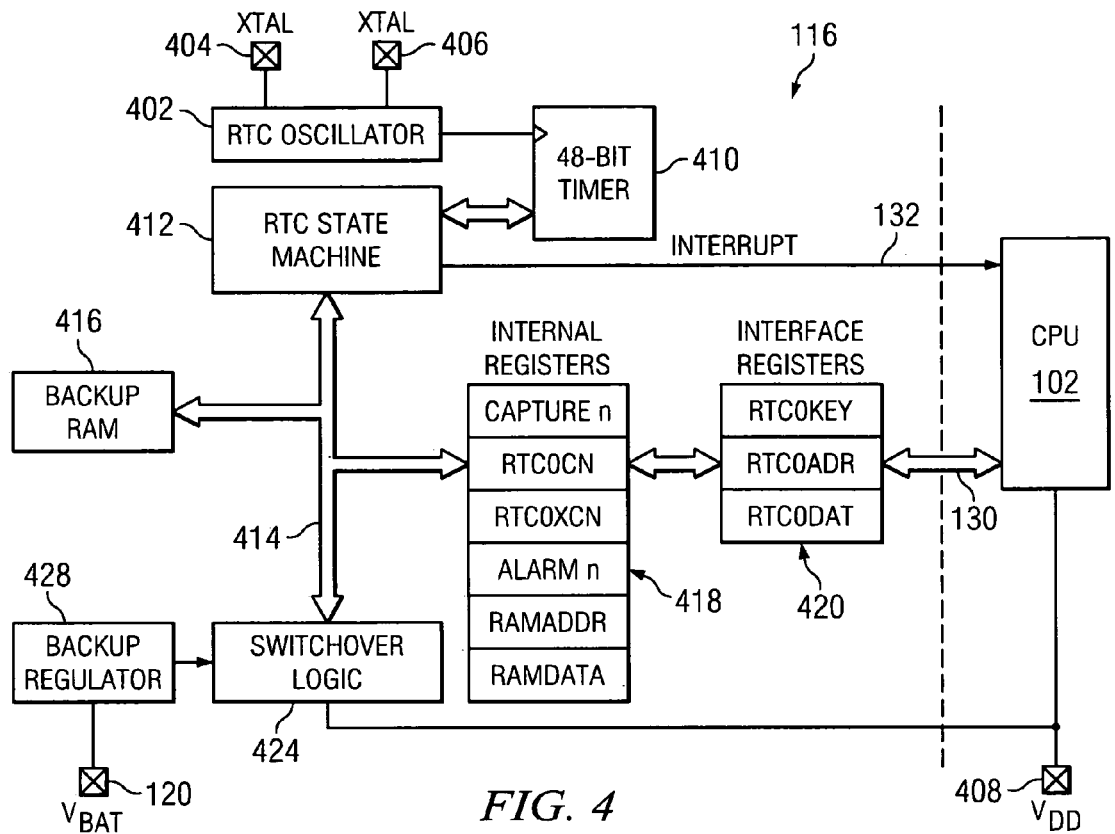
FIG. 4 illustrates a block diagram of the RTC.

Referring now to FIG. 4, there is illustrated a detailed block diagram of the low power RTC 116. There is provided a dedicated RTC oscillator 402 that is operable at a dedicated 32 kHz oscillator frequency in the crystal mode, it noted that the oscillator can operate in a non crystal mode at a frequency of 20 kHz or 40 kHz. There are provided two external pads 404 and 406 for interfacing with the crystal in a crystal-based mode or they can be connected together in a non-crystal based mode. Then the RTC 116 receives the back-up battery input on the node 120 and supply voltage $V_{DD}$ on a $V_{DD}$ pin 408. A 48-bit timer 410 is provided which is clocked by the RTC oscillator 402. An RTC state machine 412 controls the operation of the RTC 116 and is operable to interface with the 48-bit timer 410 to write data therein or read data therefrom and in general control the configuration thereof. As will be described herein below, the 48-bit timer includes a counter, latches and an alarm function. The RTC state machine 412 is operable to generate the interrupt on the line 132, when necessary, and is interfaced with an RTC internal bus 414. The internal bus 414 is operable to interface with a back-up RAM 416, which is configured with static RAM (SRAM) with a storage capacity of 64 bytes. Storage is provided by internal registers 418 which provide an internal storage for the data captured from the 48-bit timer 410 and various addressing data that is transferred between the RTC state machine 412 and the CPU 102. There is provided an interface register 420 that allows the CPU 102 an interface path to the internal registers 418. There is provided power control with a switch over logic block 424, which is operable to monitor the voltage level of $V_{DD}$ and, if it falls below a predetermined level, it will switch over to a back-up battery on the input terminal 120 (noting that the voltage $V_{DD}$ can be provided by a primary battery). There is provided a regulator circuit 428 that regulates voltage supplied to the RTC circuit and to the $V_{ss}$ generator 144 in the event of loss of main chip power.

When utilized with a 32.768 kHz watch crystal and a back-up power supply of at least 1V, the RTC 116 allows a maximum of 137 years of time keeping capability with 47-bit operation or 272 years with 48-bit resolution. This is independent of the operation of the overall MCU. Although not shown, the RTC state machine 412 also includes a missing clock detector that can interrupt the processor and the oscillators 118 from the low power mode of operation, or even generate a device reset when the alarm reaches a predetermined value.

The interface registers 420 include three registers, RTC0KEY, RTC0ADR, and RTC0DAT. These interface registers occupy a portion of the special function register (SFR) memory map of the CPU 102 and provide access to the internal registers 418 of the RTC 116. The operation of these internal registers is listed in the following Table 1 (Table 19.1). The RTC internal registers 418 can only be accessed indirectly through the interface registers 420.

TABLE 1

RTC0 Internal Registers

| RTC Address | RTC Register | Register Name | Description |
| --- | --- | --- | --- |
| 0x00-0x05 | CAPTUREn | RTC Capture Registers | Six Registers used for setting the 48-bit RTC timer or reading is current value. |
| 0x06 | RTC0CN | RTC Control Register | Controls the operation of the RTC State Machine. |
| 0x07 | RTC0XCN | RTC Oscillator Control Register | Controls the operation of the RTC Oscillator. |
| 0x08-0x0D | ALARMn | RTC Alarm Registers | Six registers used to set the 48-bit RTC alarm value. |
| 0x0E | RAMADDR | RTC Backup RAM Indirect Address Register | Used as an index to the 64 byte RTC backup RAM. |
| 0x0F | RAMDATA | RTC Backup RAM Indirect Data Register | Used to read or write the byte pointed to by RAMADDR. |

The RTC interface register RTC0KEY is a lock and key register that is operable to protect the interface 420. This register must be written with the correct key codes, in sequence, by the CPU 102 before Writes and Reads to the internal address register RTC0ADR and the internal data register RTC0DAT of the internal registers 418. The key codes are 0xa5, 0xf1. There are no timing restrictions, but the key codes must be written in order. If the key codes are written out of order, the wrong codes are written, or an invalid Read or Write is attempted, further Writes and Reads to RTC0ADR and RTC0DAT will be disabled until the next system reset. Reading of the RTC0KEY register at any time will provide to the interface status of the RTC 116, but does not interfere with the sequence that is being written. The RTC0KEY register is an 8-bit register that provides four status conditions. The first is a lock status, indicating that the two key codes must be sequentially written thereto. After the first key code is written, the status will change to the next status indicating that it is still locked, but that the first key code has been written and is waiting for the second key. The next status is wherein the interface is unlocked, since the first and second key codes have been written in sequence. The fourth status indicates that the interface is disabled until the next system reset. The RTC0KEY register is located at the SFR address 0xAE and, when writing thereto, the first key code 0xA5 is written followed by the second key code 0xF1, which unlocks the RTC interface. When the state indicates that it is unlocked, then any Write to the RTC0KEY register will lock the RTC0 interface.

The RTC internal registers 418 can be read and written using the RTC0ADR and RTC0DAT interface registers. The RTC0ADR register selects the particular RTC internal register that will be targeted by subsequent Reads/Writes to RTC0DAT. Prior to each Read or Write, the RTC interface Busy bit, bit 7 therein, should be checked to make sure the RTC interface is not busy performing another Read or Write operation. An example of an RTC Write to an internal register would involve a Wait operation when the Busy bit indicates it is busy. Thereafter, the RTC0ADR would be written with the value of, for example, 0x06, which would correspond to an internal RTC address of 0x06. This will be followed by a Write of a value of, for example, 0x00 to RTC0DAT which will Write the value 0x00 to the RTC0CN internal register (associated with the internal 0x06 address), which RTC0CN register is the RTC control register. There are generally in this embodiment, sixteen 8-bit internal registers. There are six internal registers for the captured data from the timer 410, one register for the RTC0CN control information, six alarm registers, and a back-up RAM address register and a back-up RAM data register. By first writing the control information to RTC0CN, this can be followed by writing or reading data from any of the other internal registers. To write to any of the other registers, the RTC0CN internal register has the Busy bit written thereto in order to initiate an indirect Read by the CPU 102. Once the Read is performed by the CPU 102, then the contents of RTC0DAT are loaded with the contents of RTC0CN. The system can be set such that there will be a sequence of indirect Reads by setting the appropriate bit in the control register. These will be provided with a series of consecutive Reads such that, for example, the contents of either the capture registers or the alarm registers can be completely read out. The RTC0ADR register will automatically increment after each Read or Write to a capture or alarm register. The RTC0CN register is an 8-bit register and has an enable bit, a missing clock detector enable bit, a clock fail flag bit, a timer run control bit indicating that the timer either holds its current value or increments every RTC clock period, an alarm enable bit that is operable to enable the alarm function, a set bit that causes the value in the timer registers, the capture registers, to be transferred to the RTC timer for initialization purposes and the capture bit that causes the contents of the 48-bit RTC timer to be transferred to the capture registers. There is also provided an oscillator control register, RTC0XCN, which is an 8-bit register providing for gain control of the crystal oscillator, a mode select bit for selecting whether the RTC will be used with or without a crystal, a bias control bit that will enable current doubling, a clock valid bit that indicates when the crystal oscillator is nearly stable and a $V_{BAT}$ indicator bit. When this is set, it indicates that the RTC is powered from the battery.

The RTC timer 410 is, as described herein above, a 48-bit counter that is incremented every RTC clock, when enabled for that mode. The timer has an alarm function associated therewith that can be set to generate an interrupt, reset the entire chip, or release the internal oscillator in block 112 and $V_{ss}$ generator 144 from a low power mode at a specific time. The internal value of the 48-bit timer can be preset by storing a set time and date value in the capture internal registers and then transferring this information to the timer 410. The alarm function compares the 48-bit value in the timer on a real time basis to the value in the internal alarm registers. An alarm event will be triggered if the two values match. If the RTC interrupt is enabled, the CPU 102 will vector to the interrupt service routine when an alarm event occurs. If the RTC operation is enabled as a reset source, the MCU will be reset when an alarm event occurs. Also, the internal oscillator 112 will be awakened from low power mode, if in that mode, on an RTC alarm event.

Figure 5:
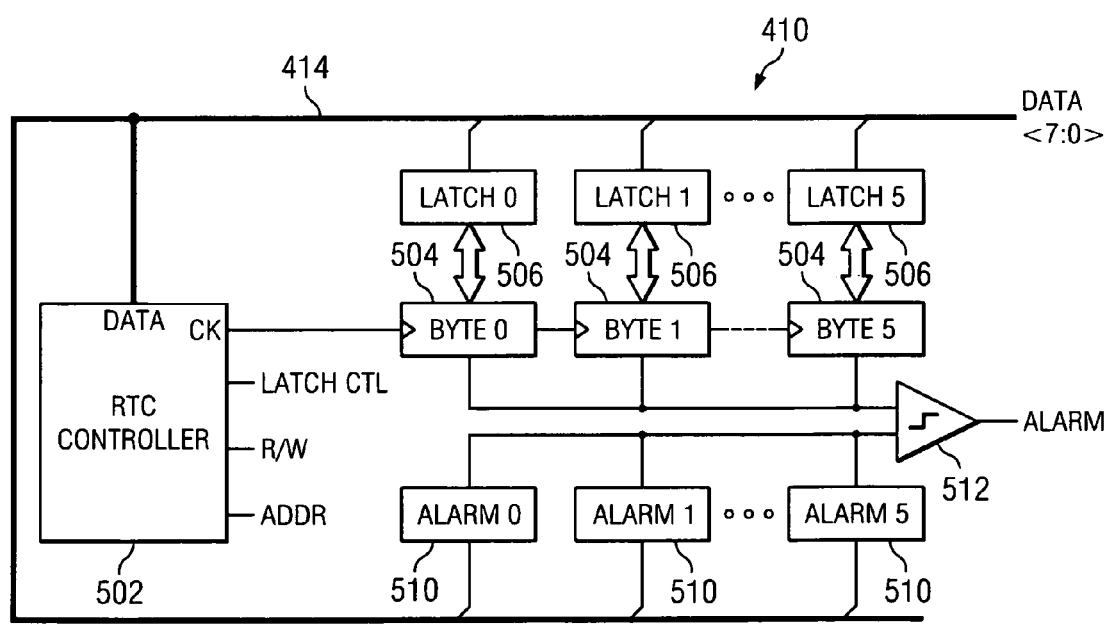
FIG. 5 illustrates a block diagram of the registers in the RTC.

Referring now to FIG. 5, there is illustrated a more detailed diagram of the 48-bit timer 410. The overall operation of the RTC, that associated with the RTC oscillator 402, RTC state machine 412 and various registers is illustrated in a single block 502 as an RTC controller. This allows generation of a clock and the various control functions, addresses, etc. The basic timer is comprised of six 8-bit counters 504, each providing a byte of information. They are labeled BYTE0, BYTE1, . . . , BYTE5. This provides a total of 48 bits. Each of the counters 504 is addressed indirectly such that the contents thereof can be read out to an associated latch 506, there being six latches 506, for either transferring information thereto or reading data therefrom (these being the capture registers in the internal registers 418). For a capture operation, where information in the timer, i.e., the current time and date, is to be output, the data will be transferred from the counters 504 to the latches 506. When the counters are to be initialized, a new count value will be transferred from the latches 506 to the counters 504. The first counter BYTE0 is clocked by a clock input from the controller 502, this being generated by the RTC oscillator 402 in FIG. 4. Each counter output will feed the next counter in a conventional manner. The first counter 504 labeled BYTE0 provides a resolution of 1/65536 seconds, the second counter 504 labeled BYTE1 provides a resolution of 1/256 seconds, the third counter 504 labeled BYTE2 provides a resolution of 1 second, the fourth counter 504 labeled BYTE3 provides a resolution of 256 seconds, the fifth counter 504 labeled BYTE4 provides a resolution of 65536 seconds and the last counter 504 labeled BYTE5 provides a value of 16,777,216 seconds.

Each of the latches 506 is interfaced to the internal 8-bit data bus 414 to allow data to be output therefrom and transferred to the capture internal registers, there being six of those registers. Therefore, each of the associated latches 506 will be consecutively addressed, they having a unique address in the address space of the RTC 116, and the outputs thereof then stored in the associated capture registers. There are also provided six alarm registers 510, each associated with one of the bytes in the counters 504, they being 8-bit alarm registers to provide a 48-bit alarm value. This alarm value is compared with the current value of the counters 504 with a comparator 512 to provide an alarm output if there is a true match. This is utilized, as noted herein above, to generate the alarm.

Figure 6:
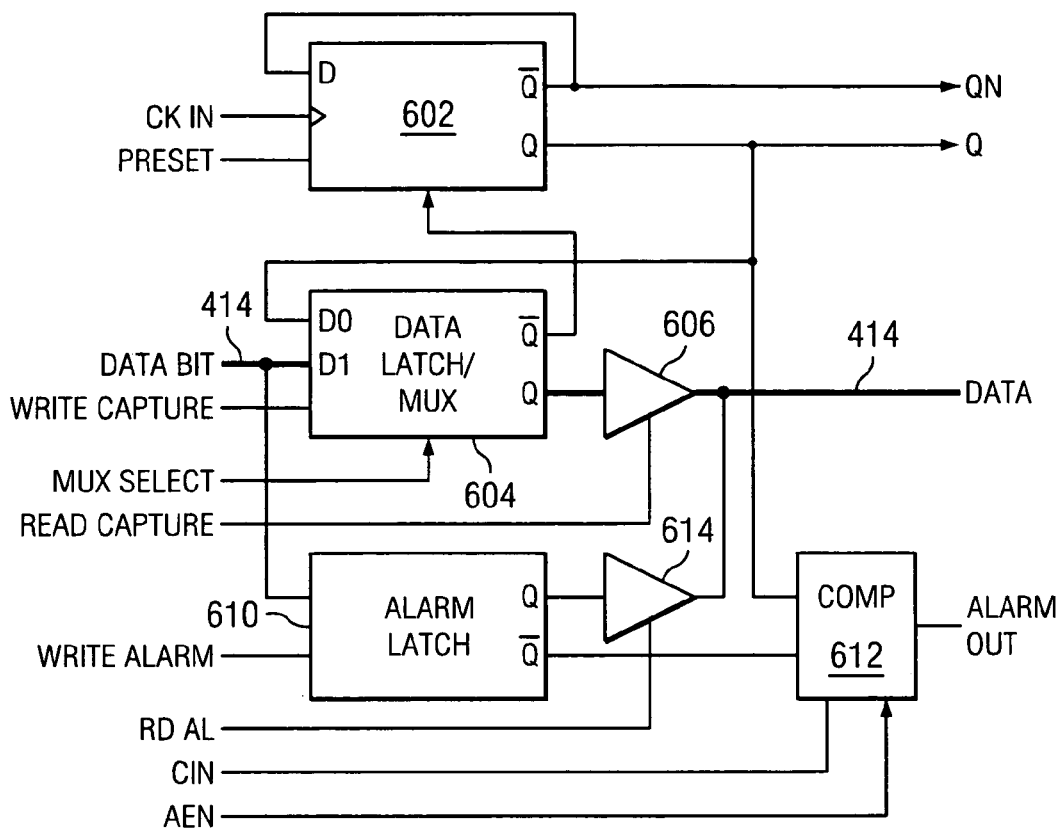
FIG. 6 illustrates a logic diagram for one bit of the register.

Referring now to FIG. 6, there is illustrated a logic diagram for a bit of counter 504. This bit is illustrated as being the first bit and, therefore, the output from the clock will clock this. However, after this bit, each bit is clocked by the falling edge of the previous counter or the Q-Bar output thereof. The clock input is input to a toggle flop 602 on the clock input thereof. The data input thereof is connected to the Q-Bar output thereof. This provides the input to the clock input of the next bit of counter 504. The Q-Bar output thereof is input to the D0 data input of a data latch/multiplexer 604, which is operable to be controlled by a multiplexer select signal to select the output of the flop 602 during a capture operation. During the capture operation, the Write signal will be received as a Write Capture signal that will cause the data on the D0 data input to be latched when data is to be captured from the counter 602. In a preset operation where the time and date are to be preset, data from the databus 414 is written to the multiplexer 604 on a D1 data input. To read the contents of the data latch/multiplexer 604, a Read capture signal enables a Read buffer 606 to read the Q-output of the data latch/multiplexer 604. This is output on the databus 414 during a Read operation. Therefore, by selecting the appropriate port D0 or D1, data can be latched into the data latch/multiplexer 604 with the multiplexer select signal to either latch input data for a preset operation or capture the output data of the counter 504 at the flop 602 for output therefrom.

In order to write data to the flop 602, the Q-Bar output of the data latch/multiplexer 604 is input to a reset input on the input of the flop 602. Whenever a preset signal is present to the flop 602, the data state of the flop 602 can be forced either high or low corresponding to the output of the latch/multiplexer 604. This allows the bit-value thereof to be "preselected."

For the alarm mode, data is written into an alarm latch 610 with a Write Alarm signal. This is basically a D-type flip-flop. The Q-Bar output thereof is input to one input of a comparator 612, after latching the value therein, the other input thereof connected to the Q-output of the toggle flop 602 associated with the counting operation. Therefore, the particular associated bit of the timer can be compared to the fixed bit for the alarm word in the 48-bit alarm word. A true compare depends on the previous alarm compare result of the previous bit being valid, such that if all bits are valid, then the entire alarm compare operation will be a true alarm operation. Therefore, when the Q-Bar output of flop 602 matches the contents of latch 610 and the previous bit had true comparison, then there will be an alarm output true. This is all enabled with an alarm enable signal. Additionally, the contents of the alarm latch 610 can be read with a Read buffer 614 that is enabled with an alarm Read signal to output the contents of the latch 610 onto the bus 414.

Figure 7:
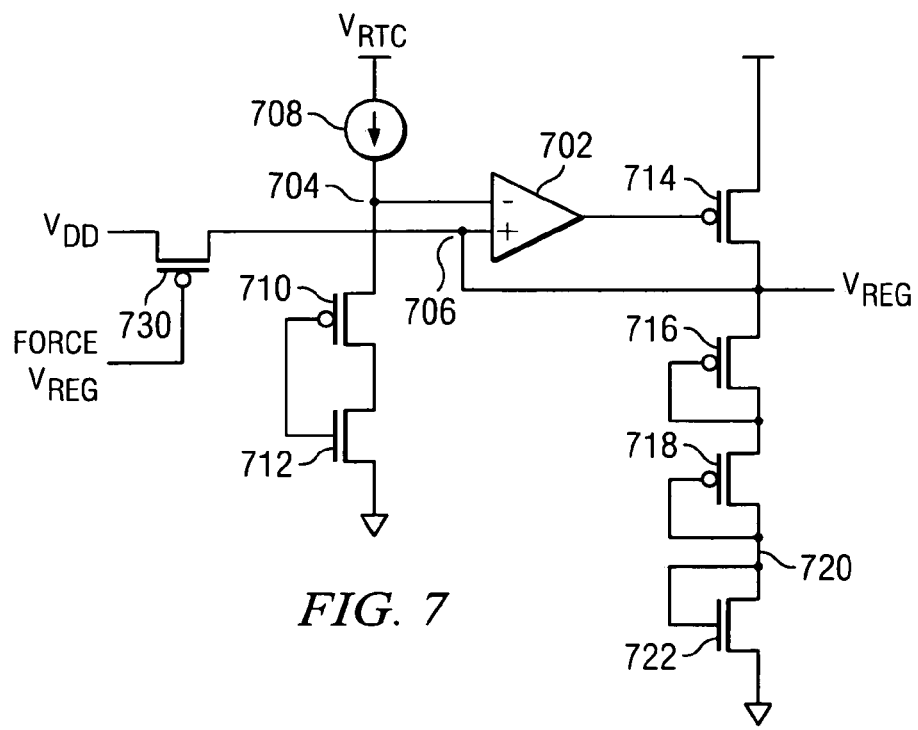
FIG. 7 illustrates a schematic diagram for the on-chip regulator.

Referring now to FIG. 7, there is illustrated a schematic diagram of the on-chip regulator associated with the RTC operation. This allows either the supply voltage to be applied to the Real Time Clock or a regulated voltage applied thereto. An amplifier 702 has the negative input thereof connected to a node 704 and the positive input thereof connected to a node 706. Node 704 is connected to one side of a current source 708, the other side thereof connected to the voltage $V_{RTC}$, this being the voltage supplied to the RTC circuit. Node 704 is connected to one side of two series connected load transistors, a p-channel transistor 710, the source/drain path thereof connected between node 704 and one side of the source/drain path of an n-channel transistor 712, the other side thereof connected to ground. The gates of transistors 710 and 712 are connected together. The output of amplifier 702 drives the gate of a p-channel transistor 714, the source/drain path thereof connected between the RTC supply voltage and the node 706, the node 706 providing the output voltage $V_{REG}$.

Node 706 is also connected to ground through three series connected transistors, comprised of two series connected p-channel transistors 716 and 718 connected in a diode configuration together between node 706 and a node 720, node 720 connected through a diode-connected n-channel transistor 722 to ground.

Node 706 is also connected to one side of the source/drain of a p-channel transistor 730, the other side thereof connected to $V_{DD}$ and the gate thereof connected to the Force VREG signal. When the Force VREG signal is low, transistor 730 conducts and $V_{DD}$ from the regulator 264 is connected to node 706. When Force VREG is high, $V_{DD}$ is disconnected from node 706 and the amplifier 702 will regulate the voltage on node 706 to that on node 704 such that the voltage to the $V_{ss}$ generator and the RTC will be maintained.

Figure 8:
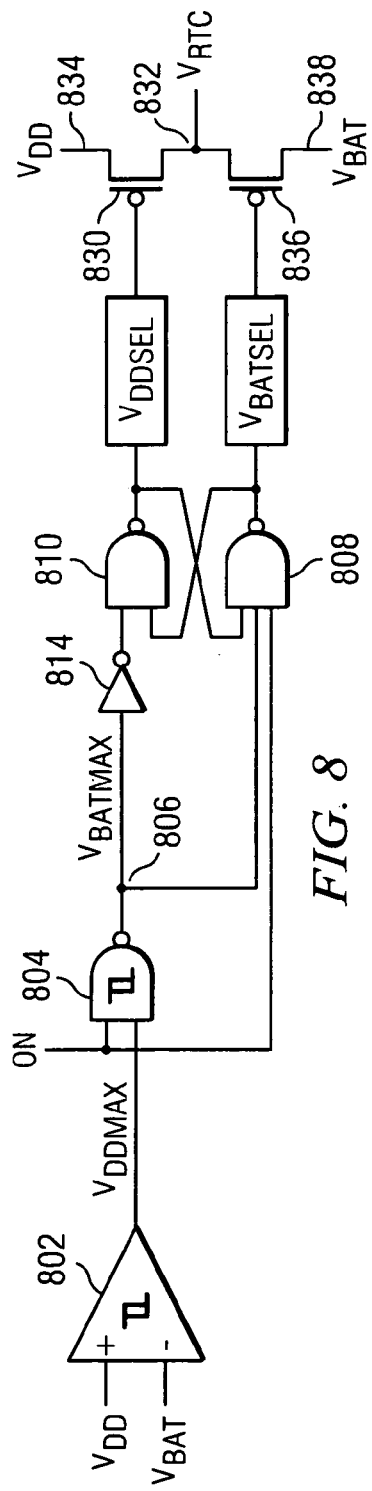
FIG. 8 illustrates a logic diagram for the power switch over device.

Referring now to FIG. 8, there is illustrated a logic diagram for the switch over logic. As noted herein above, the switch over logic is operable to monitor the input supply voltage $V_{DD}$ and the input battery voltage $V_{BAT}$. These are input to the positive and negative inputs of a comparator 802, respectively. The output of this is $V_{DDMAX}$. This is input to one input of a NAND gate 804, the other input thereof connected to an enable signal. The output of the NAND gate 804 is provided on a node 806 and this comprises the $V_{BATMAX}$ signal. Therefore, when the output of comparator 802 is true, this indicates that $V_{DD}$ is present or the highest voltage. When it is not present, or lower than the battery voltage, the output of the NAND gate 804 on node 806 will indicate that the battery is present or the higher voltage. A latch is provided comprised of two NAND gates 808 and 810. One input of NAND gate 810 is driven by the signal on node 806 inverted through inverter 814. The other input of NAND gate 810 is connected to the output of NAND gate 808. One input of NAND gate 808 is connected to node 806, the other input thereof connected to the output of NAND gate 810. NAND gate 808 is a 3-input NAND gate with the other input thereof connected to the enable signal "ON" to enable the operation thereof. The output of NAND gate 810 comprises a $V_{DDSEL}$ signal and the output of NAND gate 808 comprises the battery select signal, $V_{BATSEL}$. The signal $V_{DDSEL}$ is input to the gate of a p-channel transistor 830, which is a pass transistor connected between an RTC voltage supply node 832, $V_{RTC}$, and $V_{DD}$ on a $V_{DD}$ node 834. The $V_{BATSEL}$ signal is connected to the gate of a p-channel pass transistor 836, the source/drain path thereof connected between the node 832 and a battery node 838, connected to the battery of voltage $V_{BAT}$. The switch over circuit is utilized for the purpose of selecting either the supply voltage on the supply input pin or battery voltage on the battery input pin for powering node 832. These are conventional circuits.

Figure 9:
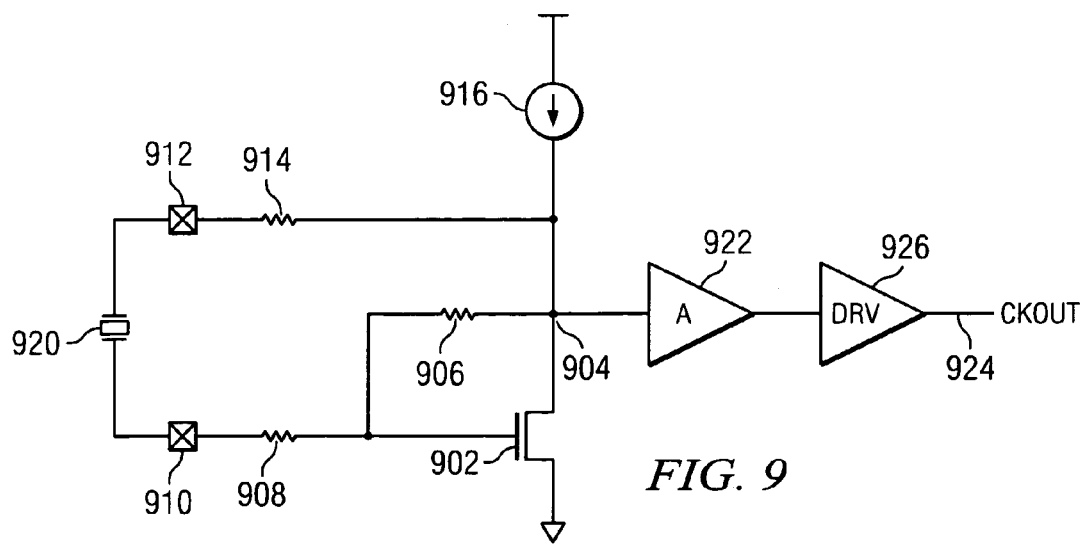
FIG. 9 illustrates a schematic diagram for the RTC oscillator in the crystal oscillation mode.

Referring now to FIG. 9, there is illustrated a schematic diagram of one configuration of the RTC oscillator. In general, this is a conventional oscillator construction configured as a crystal oscillator. An oscillator n-channel transistor 902 is provided connected between an output node 904 and ground. A feedback resistor 906 is connected between the node 904 and the gate of transistor 902. The gate of transistor 902 is connected through a resistor 908 and a first crystal terminal 910. A second crystal terminal 912 is connected through a series resistor 914 to the node 904. Node 904 is driven with a current source 916 from a supply voltage. A crystal 920, being external to the chip, is connected between the first and second crystal terminals 910 and 912. When the crystal 920 is disposed as such, this will control the oscillation of the oscillator. The node 904 drives an amplifier 922, which then drives the clock output on a node 924 through a driver 926. This is a conventional oscillator circuit.

Figure 10:
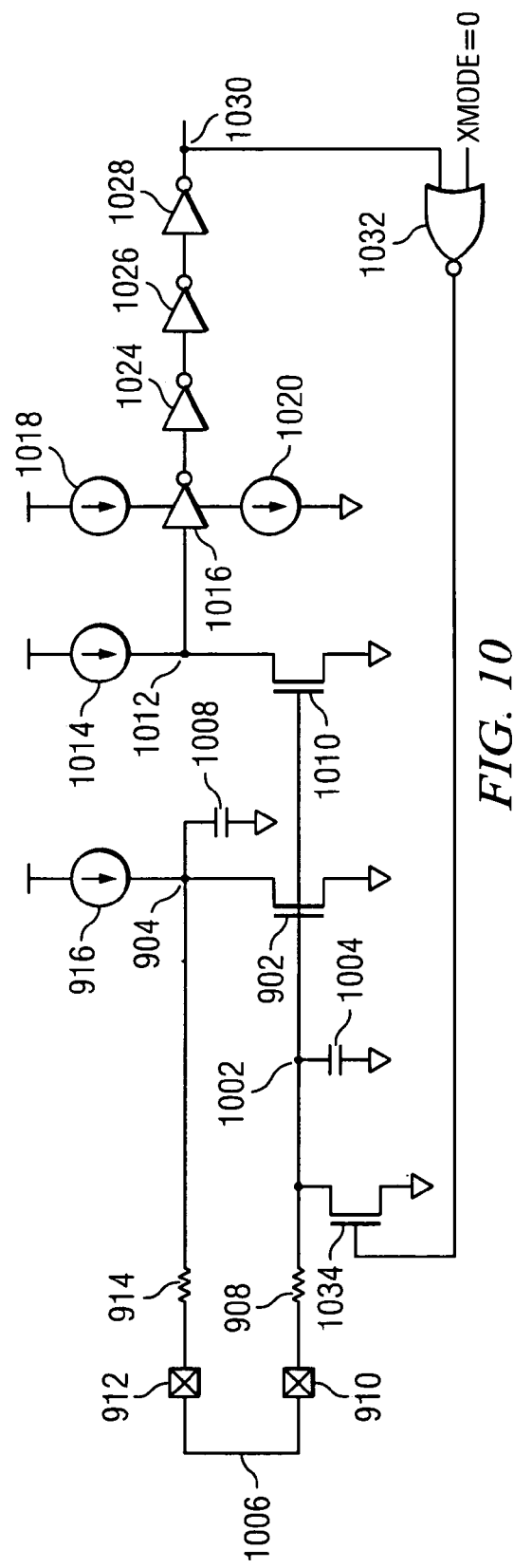
FIG. 10 illustrates a schematic diagram of the RTC oscillator in the non-crystal oscillation mode.

Referring now to FIG. 10, there is illustrated a schematic diagram of a configuration where the oscillator is configured to run without a crystal. In this configuration, the transistor 902 has the gate thereof connected to a node 1002, which has a capacitor 1004 connected between node 1002 to ground. The first and second crystal input pins 910 and 912 are connected together with an external short circuit 1006. A capacitor 1008 is connected between node 904 and ground. The gate of transistor 902 on the node 1002 also drives the gate of an n-channel transistor 1010, the source/drain path thereof connected between a node 1012 and ground. Node 1012 is driven by a current source 1014, node 1012 driving a current limiting amplifier 1016. Current limiting amplifier 1016 is limited with a positive current source 1018 and a negative current source 1020. Amplifier 1010 drives three series connected buffer amplifiers 1024, 1026 and 1028, to drive a node 1030. Node 1030 is input to one input of a two input NOR gate 1032, the output thereof driving the gate of an n-channel transistor 1034. The source/drain path of transistor 1034 is connected between node 1002 and ground.

The CPU core has a number of power management modes, these power management modes being software programmable power management modes. The first mode is an idle mode, the second is a stop mode and the third is a low power mode. In the idle mode, the operation of the CPU is halted with full voltage applied across the digital circuitry while leaving the peripherals and internal clocks active. Therefore, the timers, data converters and the high frequency precision clock and the low frequency clock remain active. In the stop mode, the CPU is halted, such that it does not incur any transition to the digital circuitry associated therewith, all interrupts and timers are placed in an inactive mode, and the operation of the internal oscillator is stopped with full voltage applied across the digital circuitry. The analog peripherals will remain in their selected states. Since the clocks are running in the idle mode, power consumption is dependent upon the system clock frequency and the number of peripherals left in active modes before entering idle mode. In the stop mode, the least active power is consumed, but voltage is still applied across the digital circuitry and, thus, there is still some leakage current present. There is provided an internal power control register, that being an 8-bit register. Bit 0 provides the idle mode, bit 1 provides the stop mode, and bit 3 provides the low power mode with the remaining bits in reserve. When either bit 1, bit 2 or bit 3 is high (not both), then the appropriate mode will be selected. Writing of a logic "1" to either of the bits will select the appropriate mode and force the processor into that mode. Additionally, the power can be changed by selecting between the high frequency crystal control for a precision oscillator and the low frequency oscillator. The high frequency or precision oscillator typically operates in the 24 MHz range and the low frequency clock operates on the order of 80 kHz. With the lower clock frequency, less power will be consumed by the digital circuitry due to the fact that less transitions will occur in the digital circuitry. Even in the stop mode, when the processor is substantially inactive, the RTC will remain running and will clock into the internal timer and maintain a running time value. This will be so even that if power is removed from the supply voltage terminal, as there is a backup battery provided. Further, the operation thereof is a very low power operational mode.

In the low power mode of operation, when bit 3 is set high, the operation of the clock circuitry will be halted, such that the states in the processor are set. Thereafter, the signal will be sent to the $V_{ss}$ generator 144 to increase the voltage on $V_{ss}$ relative to ground. The value of that voltage will be preset.

When software writes a logic 1 to an internal SUSPEND bit (OSCICN.5), the internal oscillator is suspended. If the system clock is derived from the internal oscillator, the input clock to the peripheral will be stopped until one of the following events occur:

Port 0 Match Event.
Port 1 Match Event.
Comparator 0 enabled and output is logic 0.
Comparator 1 enabled and output is logic 0.
RTC0 Oscillator Fail Event.
RTC0 Alarm Event.

When one of the internal oscillator awakening events occur, the internal oscillator, and affected peripherals resume normal operation, regardless of whether the event also causes an interrupt. The CPU resumes execution at the instruction following the write to SUSPEND bit.

Figure 11A:
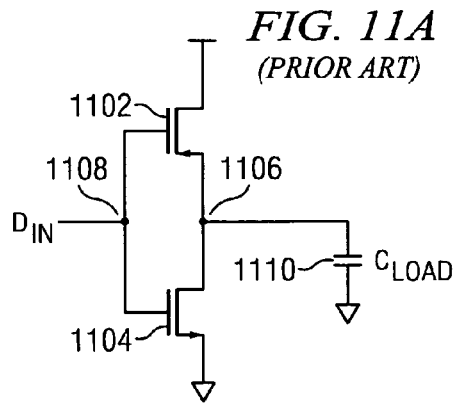
FIGS. 11a-11c illustrate the problem with the prior art operation and leakage current associated therewith.
Figure 11B:
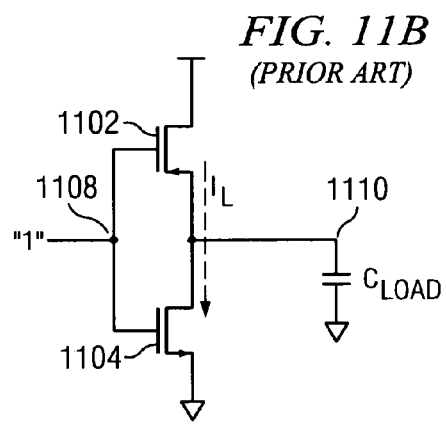
Figure 11C:
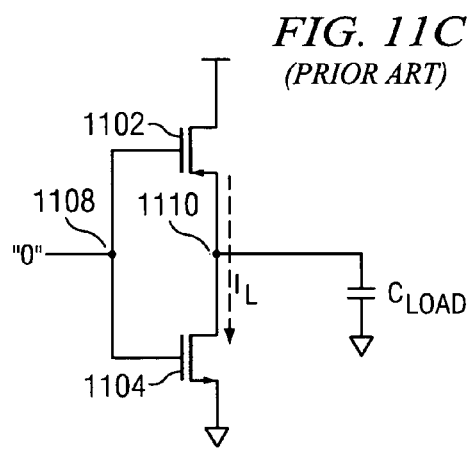

Referring now to FIGS. 11a-11c, there is illustrated a description of the prior art leakage current problem. If the clock operation is suspended in the low power mode of operation, all nodes in the digital circuit will remain at the same state as that previous to the suspension. The illustration of FIG. 11a illustrates a relatively simple inverter to illustrate the leakage problem. A p-channel, n-channel transistor combination is comprised at the p-channel transistor 1102 connected in series with n-channel transistor 1104 between the $V_{dd}$ and ground. The drains of the two transistors 1102 and 1104 are connected together to an output node 1106 and the gates thereof connected together and to an input node 1108. A capacitor load 1110 is illustrated, as most nodes in an MOS system will be capacitive in nature.

FIG. 11b illustrates the condition wherein a logic "1" is disposed on node 1108, such that the logic state on node 1110 is a logic "0." In this condition, transistor 1102 should be completely off. However, there will be leakage currents flowing there through, this leakage current resulting from a number of things, one of which is sub threshold conduction. In a similar manner, when a logic "0" is disposed on node 1108, node 1110 is disposed at a logic "1." This will result in the transistor of node 1104 being turned off, but there will be a leakage current flowing there through due to the leaky nature of the transistor. This is typical in 0.13 micron technologies. As the line widths go up, the leakage currents will be reduced.

Figure 12:
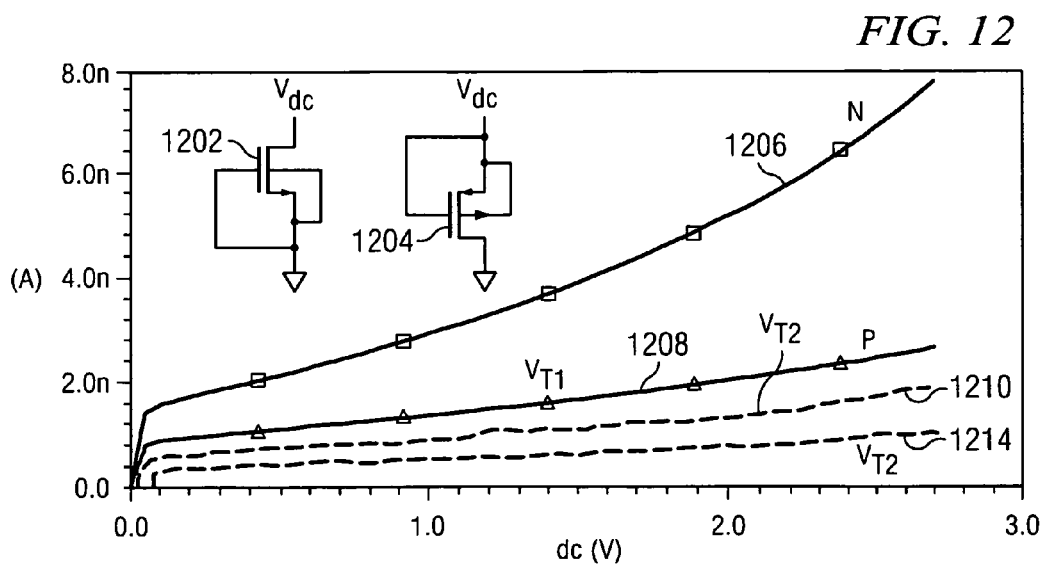
FIG. 12 illustrates a diagrammatic view of the operation of an n-channel and a p-channel transistor as a function of the drain-to-source voltage.

Referring now to FIG. 12, there is illustrated a diagrammatic view of the operation of n-channel and p-channel transistors as a function of the voltage $V_{ds}$, the drain-to-source voltage across the source/drain of the transistor. There are two transistors illustrated, an n-channel transistor 1202 and a p-channel transistor 1204. The n-channel transistor has the gate and source thereof connected together, as does the p-channel transistor 1204. The drain-to-source paths of both transistors 1202 and 1204 are connected between the supply voltage and ground, the supply voltage noted as $V_{dc}$. The plot is for the current through the transistor as a function of the voltage, which voltages range from 0.0 V to 3.0 V.

It can be seen from the plot that the n-channel transistor 1202 has a plot 1206 associated therewith. The transistor, at the very, very low voltages of less than 0.1 V goes into a linear range of operation. After that voltage and above that voltage, the transistor operates in a saturation region. As the $V_{ds}$ goes up, the current through the transistor would increase. Compare this to the p-channel transistor 1204. For a given threshold voltage, a curve 1208 will exist. It can be seen that, for a p-channel transistor, the current there through as a function of the $V_{ds}$ is less. Also, the p-channel transistor is plotted for two additional threshold voltages, associated with curves 1210 and 1214. Therefore, the amount of current through the transistor is a function of threshold voltage. It can be seen that, as the threshold voltage changes, so does the leakage current. Also, it can be seen that increasing the threshold voltage for the n-channel transistor will have more effect on the leakage current.

In order to reduce power, as described herein above, when the sleep mode or low power mode of operation is entered, the desire is to operate in a mode where instructions in the CPU are not being carried out but the states are retained. To facilitate this, the voltage across the source and drains of substantially all of the transistors is reduced. There are two ways to achieve this. The first is to utilize a regulation circuit to reduce the voltage on $V_{dd}$. The second is to raise the voltage at ground. Since the overall current draw when the clock is halted is substantially the leakage current, the present embodiment discloses the technique to raise $V_{ss}$ voltage up towards $V_{dd}$ by disposing a voltage source between the $V_{ss}$ terminal of the powered devices in the MCU that are in low power mode and ground. Of course, it should be understood that there are a number of devices, such as the RTC, that will remain in operating condition, as the low frequency clock must operate in order to provide an accurate time base during the low power mode of operation.

There are two considerations when raising the $V_{ss}$ terminal of all of the powered devices above ground. The first is whether to raise the entire transistor, including the "body" of the transistor above ground or leaving the "body" or "bulk" connected to ground. The n-channel transistor, in a typical configuration, is disposed within the substrate. Thus the substrate is typically connected to ground and the source of the n-channel transistor, that being an n-type region, also being connected to the p-substrate. Thus, the body or bulk of the transistor will be connected to the one terminal. In a similar manner, the bulk or body of the p-channel transistor is typically an n-well and the p-source contact region within the well is typically connected to the well, with both connected to $V_{dd}$. The $V_t$ of the transistor is directly correlated to the voltage on the source of the n-channel transistor, for example, or on the p-channel transistor. In the n-channel transistor case, if the body is disposed at a lower voltage than the source, the $V_t$ will increase. As the $V_t$ increases, the leakage due to sub-threshold conduction will decrease, this being well discussed in the literature. For example, if the substrate were disposed at a voltage of −1.0 V and the source of all the n-channel transistors in a circuit were connected to ground, this will result in a larger $V_t$ for the n-channel transistors and, thus, a lower leakage current. As will be described herein below, this is utilized to further reduce leakage current due to sub-threshold conduction.

The threshold voltage for an MOS transistor is defined by the relationship:

$$V_T = V_{TO} + \gamma(\sqrt{|-2\phi_F + v_{SB}|} - \sqrt{|-2\phi_F|})$$

where:

$$V_{TO} = \phi_{GB} - 2\phi_F - \frac{Q_{b0}}{C_{ox}} - \frac{Q_{ss}}{C_{ox}}$$

and the body-factor, body-effect coefficient or bulk threshold parameter γ is defined as:

$$\gamma = \frac{\sqrt{2q\varepsilon_{si}N_A}}{C_{ox}}$$

It can be seen that, as the source-to-bulk voltage, $v_{sb}$, increases, so does $V_T$.

Figure 13:
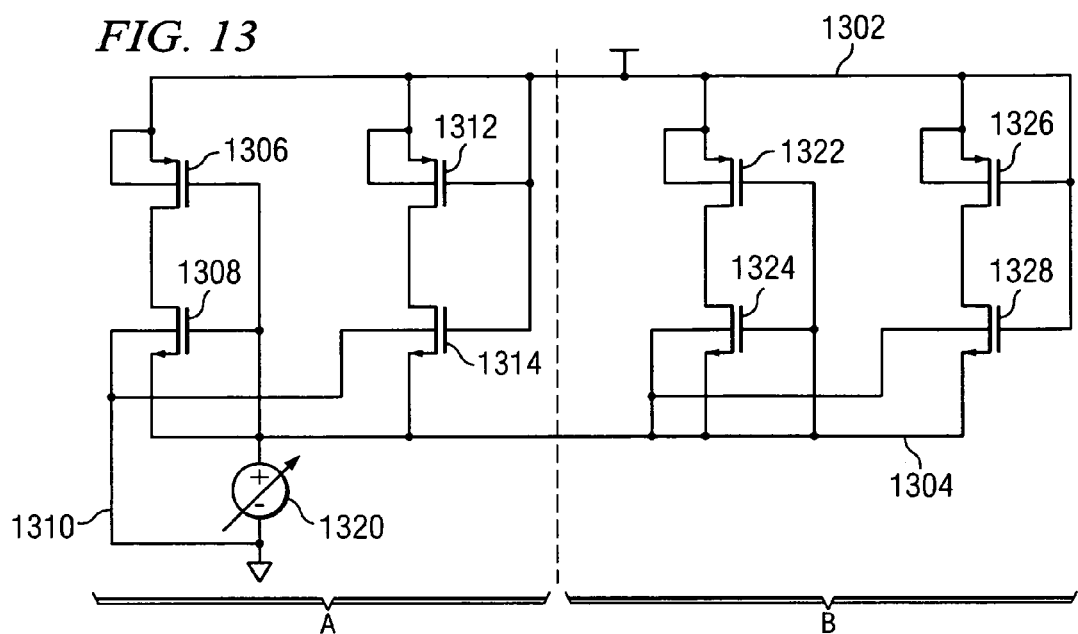
FIG. 13 illustrates a schematic diagram for a test circuit illustrating the operation of the $V_{ss}$ generator.

Referring now to FIG. 13, there is illustrated two test circuits to illustrate two different configurations of raising the voltage $V_{ss}$. In this embodiment, there are illustrated two different circuits, one defined as the "A" circuit and a second defined as the "B" circuit. Both circuits are connected between a $V_{dd}$ node 1302 and a $V_{ss}$ node 1304. The "A" circuit is comprised of two configurations of series connected p-channel and n-channel transistors. The first configuration provides a p-channel transistor 1306 connected in series with an n-channel transistor 1308 with the source of the p-channel transistor 1306 connected to the supply terminal 1302 and the source of the n-channel transistor 1308 connected to the $V_{ss}$ terminal 1304. The gates of the transistors 1306 and 1308 are connected to the $V_{ss}$ terminal 1304. In this configuration, transistor 1306 will be turned on and transistor 1308 will be turned off, such that the only current through these transistors will be leakage current through transistor 1308. In this configuration, the bulk of transistor 1308 is connected to a ground terminal 1310 and the bulk of transistor 1306 is connected to the supply terminal 1302. The second configuration is comprised of a p-channel transistor 1312 connected in series with an n-channel transistor 1314, the source of transistor 1312 connected to the supply terminal 1302 and the source of transistor 1314 connected to the $V_{ss}$ terminal 1304. The gates of both transistors 1312 are connected to the supply terminal 1302, such that transistor 1314 is turned on and transistor 1312 is turned off. Thus, the only current through these two transistors will be that associated with the leakage current through transistor 1312. The body of transistor 1312 is connected to $V_{dd}$ and the body of transistor 1314 is connected to the ground terminal 1310. In this configuration, there is provided a voltage source 1320 connected between the $V_{ss}$ terminal and ground. This is a variable voltage source that can have the voltage varied such that the voltage of the $V_{ss}$ terminal 1304 can go between ground and a predetermined reference voltage. This is illustrated in the "A" plot in FIG. 14. In this configuration, it can be seen that this circuit exhibits at Vss or Vdd a certain leakage current. As the voltage is increased, it can be seen that the current decreases to a substantial extent.

By comparison, the "B" circuit has a similar configuration with two series connected transistors, p-channel transistor 1322 and an n-channel transistor 1324, with the source of transistor 1322 connected to supply node 1302 and the source of transistor 1324 connected to $V_{ss}$ node 1304 and the gates of transistors 1324 and 1322 connected together and to node 1304. The body of transistor 1322 is connected to the supply node 1302 and the body of transistor 1324 is connected to node 1304, such that, if node 1304 is raised above ground, so is the body of transistor 1324. This configuration again is operable to turn off transistor 1324, such that the leakage there through is primarily due to the current through transistor 1324. Similar to the "A" circuit, a second pair of transistors, a p-channel transistor 1326 and an n-channel transistor 1328, are connected in series between node 1302 and node 1304, with the source of transistor 1324 connected to node 1302 and the source of transistor 1324 connected to node 1304. The gates of transistors 1326 and 1328 are connected together and to the supply node 1302. The body of transistor 1326 is connected to the node 1302 and the body of transistor 1328 is connected to node 1304. In this configuration, transistor 1326 is turned off, such that the only current through transistor 1326 and 1328 will be leakage current through transistor 1326.

Figure 14:
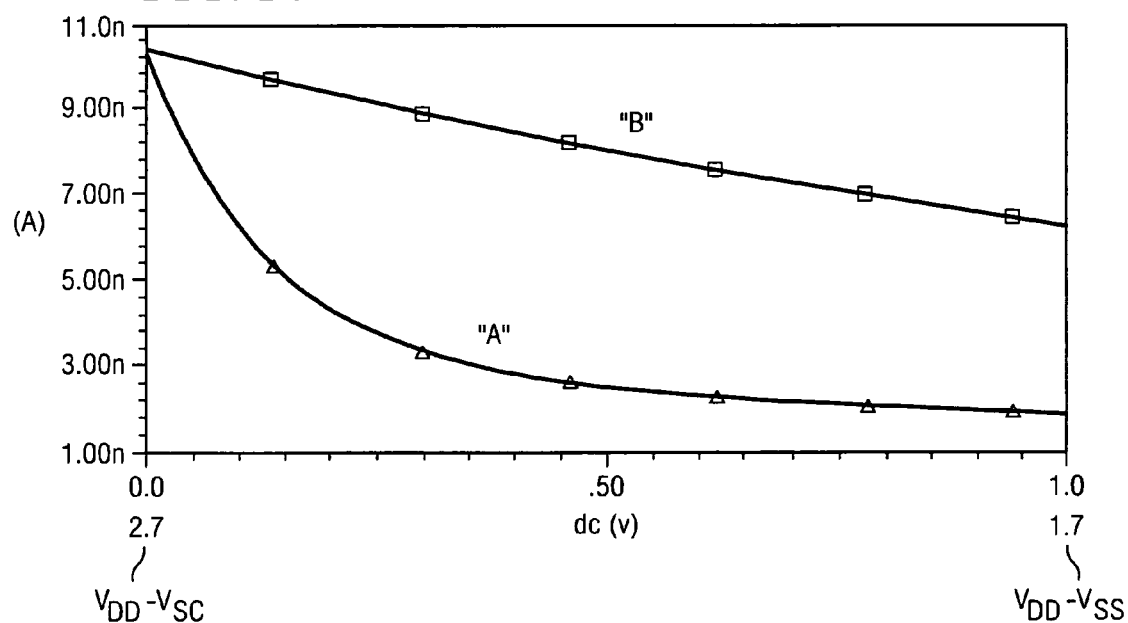
FIG. 14 illustrates a plot of current vs. voltage for the circuit of FIG. 13.

It is noted in the plot of FIG. 14 that the "B" circuit associated with the correspondingly referenced curve. It can be seen that the current is substantially higher for this configuration. Thus, by maintaining the body of the n-channel transistor at ground when $V_{ss}$ is increased, this reduces the amount of leakage current as a function of the voltage between $V_{ss}$ and ground. Thus, it is not necessary to increase the voltage of $V_{ss}$ above ground as much as would be the case with the "B" circuit.

With respect to FIG. 12, it can be seen that the n-channel transistor, as opposed to the p-channel transistor, will have a larger deviation and current versus $V_{ds}$ as a function of a increase in $V_t$. Thus, it would be preferable to utilize the power supply 1320 disposed between ground and the source of the n-channel transistors, as opposed to disposing the source 1320 between the terminal 1302 and the source of p-channel transistors 1306, 1312, 1322 and 1326. Although this would provide similar results, the connection of the body of the p-channel transistors to the $V_{dd}$ terminal would not provide as big a difference versus voltage. Therefore, the preferable connection of the power source 1320 is between ground and the $V_{ss}$ terminal. However, it should be understood that either configuration will reduce leakage current in the low-power mode of operation wherein all computational operations have been terminated. Further, it should be understood that, even though the $V_{ss}$ terminal 1304 has been raised above ground, the circuitry may still operate under control of an operating clock, depending upon the voltage. However, the system will typically not work as specified and, therefore, it is effectively inoperative at these lower voltages.

Figure 15:
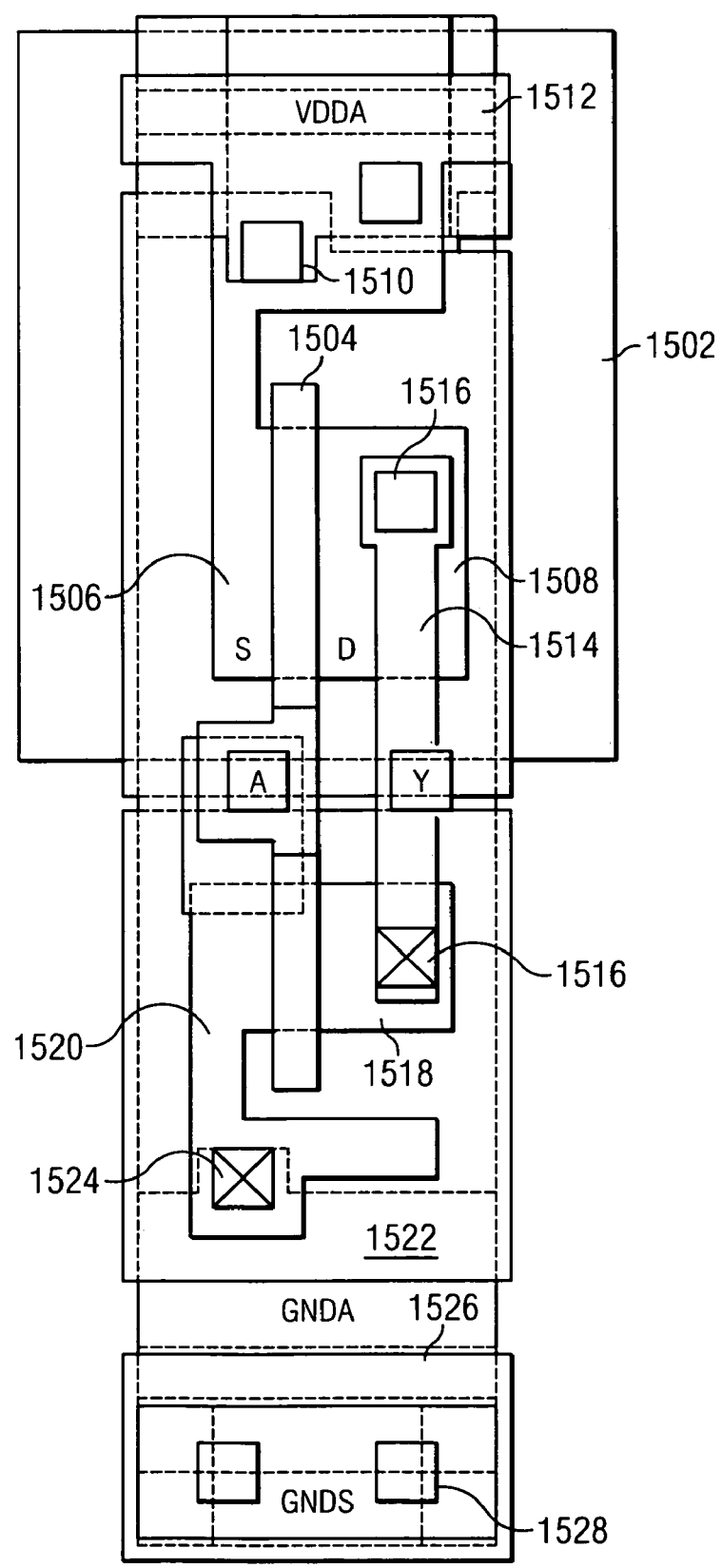
FIG. 15 illustrates a layout for a simple inverter utilizing the $V_{ss}$ generator operation.

Referring now to FIG. 15, there is illustrated a diagrammatic view of the layout of two of the transistors 1306 and 1308, for example, disposed in series. An n-well 1502 is provided for containing the p-channel transistor. The gate of the p-channel transistor is formed of a layer of poly 1504 disposed over an active region with the source provided in a source contact region 1506 and the drain provided in a drain contact region 1508. The source 1506 of the transistor is connected through a contact 1510 to a $V_{dd}$ metal run 1512, with the n-well 1502 connected to the $V_{dd}$ terminal 1512 also. A drain connect 1514 is connected from a contact 1516 with the drain 1508 to a second contact 1516 which contacts a drain contact 1518 of an n-channel transistor. This being an n-doped region in the p-substrate. The gate run 1504 extends down across an active region in the substrate to separate the drain contact region 1518 from a source contact region 1520, both regions 1518 and 1520 formed in the substrate. The source contact region 1520 is connected to $V_{ss}$ run 1522 through a contact 1524. The substrate is connected to a ground run 1526 through contacts 1528. Therefore, the $V_{ss}$ terminal which is associated with the source contacts of all of the n-channel transistors that would normally be connected to ground are separated from ground by defining a separate $V_{ss}$ terminal separate from ground, to which the substrate or body of the n-channel transistors as connected.

Referring now to FIG. 16, there is illustrated a simplified diagrammatic view of one application, wherein the MCU is represented by a block 1602 and it is isolated from ground by a $V_{ss}$ generator 1604, but there is a connection 1606 to ground for the body of the transistors. The low voltage regulator 264 is illustrated as connecting between a regulated voltage to a higher voltage to provide the $V_{dd}$ reference on the input to the MCU. This regulator 264 has a range of 0.9 V to 5.0 V.

Referring now to FIG. 17, there is illustrated the operation described herein above with respect to the generator. There is illustrated a central two stage inverter which illustrates data in and data out, there being a plurality of these invertors on the chip. The first inverter is comprised of series connected p- and n-channel transistors. A series connected p-channel transistor 1702 is connected between $V_{dd}$ and a node 1704 with the source thereof and the body thereof connected to $V_{dd}$ and the drain thereof connected to node 1704 and the gate thereof connected to an input node 1708. An n-channel transistor 1710 has the drain thereof connected to node 1704, the drain thereof connected to a $V_{ss}$ node 1712 and the gate thereof connected to node 1708. The second stage of the inverter is comprised of two series connected transistors, a p-channel transistor 1714 having the source thereof and body thereof connected to $V_{dd}$, the drain thereof connected to an output node 1716 and the gate thereof connected to node 1704, an n-channel transistor 1720 having the drain thereof connected to node 1716, the source thereof connected to node 1712 and the gate thereof connected to node 1704. The body of both of the n-channel transistors 1710 and 1720 are connected to ground. The node 1712 is isolatable from ground by a driving transistor 1724, which is an n-channel transistor having the drain thereof connected to node 1712 and the body and source thereof connected to ground. The gate thereof is connected to a node 1726. Node 1726 is connectable to $V_{dd}$ through a switch 1728 or to the output of an amplifier 1730. This is controlled by a Wake Up signal. The amplifier 1730 has the positive input thereof connected to node 1712 and the negative input thereof connected to the output of a digital-to-analog converter (DAC) 1734. This DAC 1734 has the power supply thereof connected to $V_{dd}$ and the ground terminal thereof connected to ground, such that it is always powered and is never powered down. It receives a data input voltage which defines the voltage on the node 1712. Therefore, when switch 1726 is connected and switch 1728 is opened, amplifier 1730 will drive the transistor 1724 in a voltage follower manner. This, of course, depends upon what the value on the input of the DAC is, this being a digital value that is provided in a latch that is powered from $V_{dd}$ during low-power operation. Therefore, it can be seen that the full powered $V_{ss}$ generator is comprised of the DAC 1734, the amplifier 1730 and the transistor 1724. Once activated, it will apply the particular voltage thereto. During normal operation mode, switch 1726 will be open and switch 1728 will be closed, such that transistor 1724 will be fully on and pull node 1712 to ground.

Figure 18:
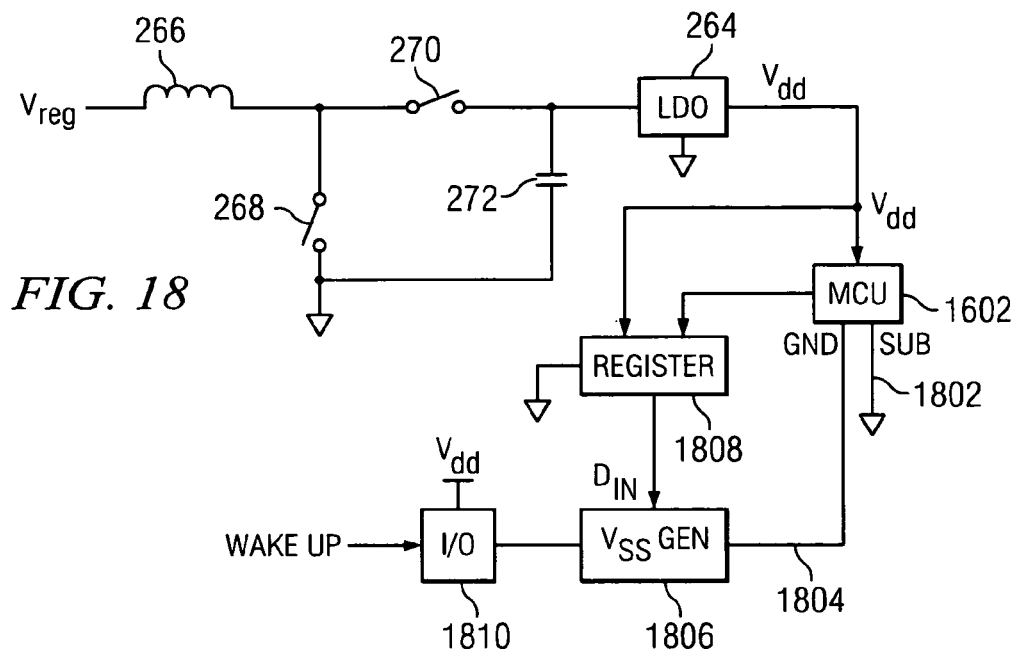
FIG. 18 illustrates a detailed control system for the low powered ground generator.

Referring now to FIG. 18, there is illustrated a more detailed diagrammatic view of the $V_{ss}$ generator. In this operation, it can be seen that the MCU 1602 (this representing the circuitry in the integrated circuit that is required to be placed into the low power mode of operation, this typically being the digital processing circuitry) is connected between $V_{dd}$ with a substrate output 1802 connected to ground and a $V_{ss}$ output connected to the $V_{ss}$ generator 1806 via a line 1804. It is operable, as described herein above, to vary the voltage on node 1804. A register 1808 is provided for latching a value of $D_{in}$ therein. This value of $V_n$ is input thereto by the MCU 1602 during a normal operational mode, or it could be placed therein during manufacturing as a fixed value or even input thereto by a user via some other type of serial interface. In any event, this register 1808 is part of the integrated circuit and fabricated in an integral manner therewith. However, it should be noted that the register 1808 is a powered register, such that all the circuitry therein is disposed between $V_{dd}$ and ground.

This $D_{in}$ is then input to the DAC 1734 portion of the ground generator 1806. The switch control is provided by an input/output circuit 1810 which is operable to receive a Wake Up signal. This input/output circuit 1810 is powered by $V_{dd}$ such that all circuitry therein is disposed between $V_{dd}$ and ground. Again, it merely utilizes two switches. Therefore, the Wake Up signal can merely be a PIN that is toggled high or low such that, when the system is in the low power mode of operation, the switch 1726 can be opened and switch 1728 closed to resume the normal operating mode of operation.

Figure 19:
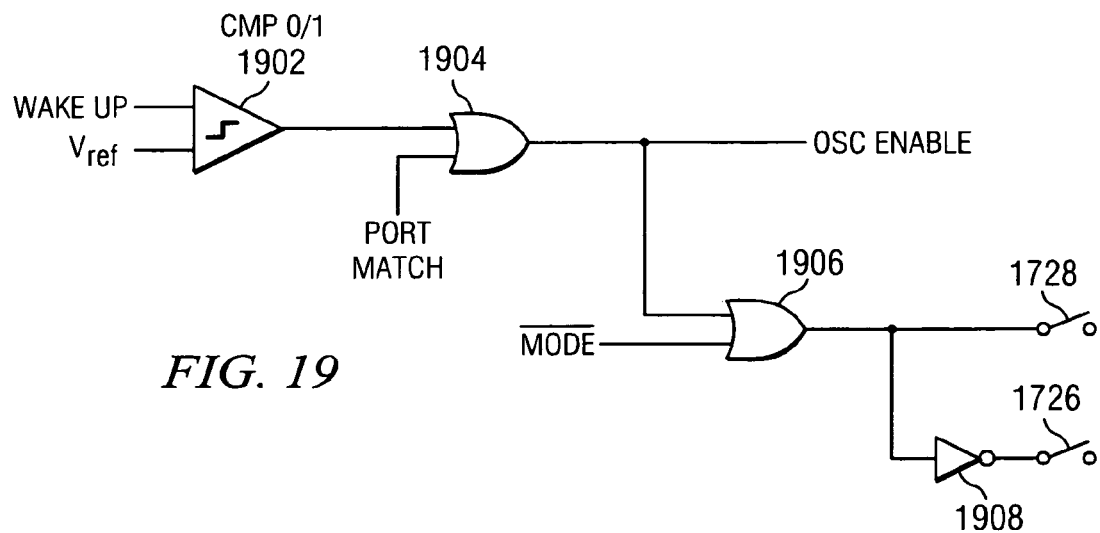
FIG. 19 illustrates a schematic diagram of the controls for placing the system into a suspend operation and for the wake-up operation therefrom.

Referring now to FIG. 19, there is illustrated a diagrammatic view of the control circuitry for placing the system in either the suspend mode of operation or for waking the system up from the suspend mode of operation. As noted herein above, the MCU has a plurality of ports associated therewith, these ports configurable to allow the part to function as a digital output, a digital input or an analog input/output. There are provided in the MCU two comparators, one for generating a CMP1 signal and one for generating a CMP0 signal. They are referred to by the reference numeral 1902, there being a single one illustrated in FIG. 19. It should be noted that only one of these comparators is required for the suspend mode of operation. The one input of the comparator 1902, either the CMP0 or the CMP1 comparator, is connected to the wake up signal and one connected to a voltage reference signal. Therefore, the comparator 1902 can monitor an analog input, noting that this comparator 1902 is not synchronous circuitry, i.e., it is not controlled by the clocks. Therefore, since it is manufactured utilizing combinatorial logic, it will operate independent of the clock circuitry as long as it is powered. The power to the comparator 1902 is not controlled by the $V_{ss}$ generator 1806 but, rather, full power is always applied to the comparator 1902 even during the suspend mode of operation. The output of the comparator 1902 is input to one input of an OR gate 1904, the other input thereof which is connected to an internally generated signal, the PORT MATCH signal. This is a register value that the MCU 1602 writes to an initial configuration register. This signal is the signal that allows the MCU to place the system into the suspend mode of operation. The output of the OR gate 1904 provides an oscillator enable signal that is operable to place the oscillator or clock operation into a "halt" mode of operation wherein the clock operation thereof is halted. The output of the OR gate 1904 is also input to a mode OR gate 1906, which receives an internal mode signal. This internal mode signal is received from the CPU through a special function register (SFR) that controls whether the suspend mode of operation is one that utilizes the $V_{ss}$ generator 1806. As described herein above, the system can operate in a suspend mode of operation, or which is sometimes referred to as a "sleep mode," wherein the full voltage is applied across the MCU 1602 during the suspend mode of operation, but only the oscillator clocking operation is disabled. However, this mode control can control the gate 1906, such that the OR gate 1904 will control the operation of the switches 1728 and 1726 in the fully suspended low power mode of operation. Thus, when the oscillator is enabled during the normal mode of operation, the switch 1728 will be active and the switch 1726 will be inactive, as the output of the gate 1906 is passed through an inverter 1908. Therefore, in operation, when the system is to be placed into the fully suspended low power mode of operation wherein the $V_{ss}$ generator 1806 is activated, the mode control signal will be set to a "low" to allow the gate 1904 to control the switches 1726 and 1728. When the PORT MATCH signal is set by an MCU 1602, this will cause the output of the OR gate 1904 to go low, disabling the oscillator and also cause the output of the gate 1906 to go low, turning off switch 1728 and turning on switch 1726. When switch 1726 is turned on, the output of the DAC 1734 controls the operation of the $V_{ss}$ generator 1806 and raises the source terminal above ground. When wake up occurs, all that is necessary is to raise the wake up pin, an external terminal, above the reference voltage on the comparator 1902, which will cause the output of the comparator 1902 to go "high" and raise the output of the OR gate 1904 high, thus enabling the oscillator. This will also cause the switch 1728 to close and the switch 1726 to open. It is noted that all the circuitry in FIG. 19 is combinatorial logic (or more specifically, asynchronous with respect to the system clock) and full voltage is applied to such circuitry or sufficient voltage to allow such circuitry to continue to operate, such that the outputs thereof will be toggled regardless of the state of the $V_{ss}$ generator 1806. In the normal sleep mode where the system is not fully suspended, the switch 1728 is forced to an "on" position by raising the Mode control signal to a "high," wherein the switch 1726 is "off." This allows the full voltage to be maintained across the digital circuitry.

Figure 20:
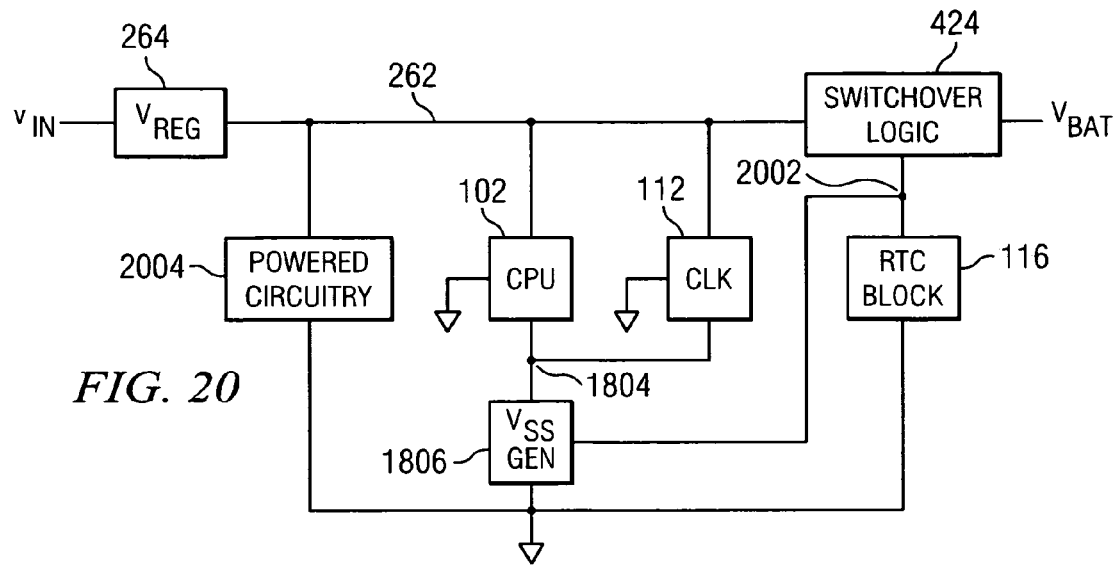
FIG. 20 illustrates a diagrammatic view for controlling multiple blocks in either the suspend operation or the full mode of operation.

Referring now to FIG. 20, there is illustrated a diagrammatic view of an alternate embodiment illustrating the operation of the $V_{ss}$ generator 1802 and multiple blocks that can be powered or not powered and also blocks that can be powered by the battery. In this embodiment, the $V_{ss}$ generator 1806 is illustrated as providing power to the source terminal 1804, such that there will be a difference in voltage between the node 1804 and ground when the fully suspended mode of operation is entered using the $V_{ss}$ generator 1806. However, there is also provided the RTC block 116 that is connected between a power terminal 2002 supplying the voltage $V_{RTC}$ which voltage is illustrated as being provided to the $V_{ss}$ generator. The switch over logic 424, when external power is applied to the regulator 264, will provide the regulated voltage $V_{REG}$ to both the $V_{ss}$ generator 1806 and to the CPU 102. The CPU 102 and all or a portion of the clock circuitry 112 is disposed between the $V_{DD}$ terminal 262 and the source terminal 1804. In addition, there can be provided other powered circuitry 2004 that is always disposed between the $V_{DD}$ terminal 262 and ground that is not controlled by the $V_{ss}$ generator 1806. Therefore, the $V_{ss}$ generator 1806 will only control the power supply voltage across select portions of the digital circuitry. This circuitry, as described herein above, can be actively clocked during the suspend mode or the clock circuitry 112 can be halted during this operation. The purpose for halting the clock, as described herein above, is to reduce power consumption. The purpose for raising the voltage on the terminal 1804 above ground is for reducing the loss due to leakage occurring during the time that the digital logic circuitry is not being switched between logic states. However, there may be certain portions of the digital circuitry that requires a fully operational mode. This could be either combinatorial logic or it could be synchronous circuitry that requires a clock. There could even be portions of the instruction-based digital circuitry that would operate during the suspend mode of operation. However, to reduce the leakage occurring during the suspend mode of operation, the large portion of the suspend digital circuitry would be controlled by the $V_{ss}$ generator 1806.

Figure 21:
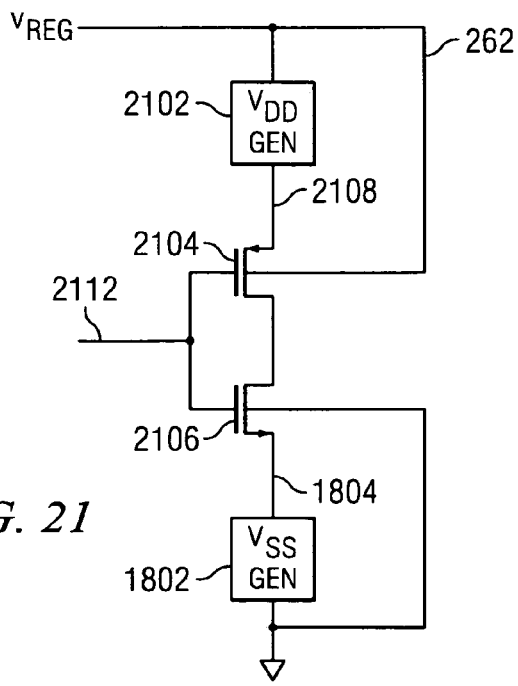
FIG. 21 illustrates an alternate embodiment illustrating the use of dual source generators.

Referring now to FIG. 21, there is illustrated an alternate embodiment wherein the $V_{ss}$ generator 1806 is duplicated as a $V_{DD}$ generator 2102. In this illustration, there are provided two series connected transistors, a p-channel transistor 2104 and an n-channel transistor 2106. The p-channel transistor 2104 has the source thereof connected to a source terminal node 2108 and the drain thereof connected to a data output node 2110. The gate of the transistor 2104 is connected to a data input terminal 2112. The n-channel transistor 2106 has the drain thereof connected to node 2110 and the source thereof connected to the source terminal 1804. The $V_{ss}$ generator 1802 is operable to control the voltage on the source terminal 1804. The $V_{DD}$ generator 2102 is connected between the regulated input voltage on the node 262 and the source terminal 2108 that provides power to the source of the p-channel transistor 2104. It should be understood that the n-channel transistor 2106 and the p-channel transistor 2104 represent a plurality of transistors connected to the respective source terminals 1804 and 2108. The p-channel transistor 2104 has the body thereof connected to the $V_{REG}$ or $V_{DD}$ input on node 262 and the n-channel transistor 2106 has the body thereof connected to ground. Therefore, in this configuration, both the n-channel and p-channel transistors have the source terminal thereof controlled to increase the difference between the voltage thereon and the respective one of the positive and negative terminals across the entire circuit. The threshold voltages associated therewith are increased during the suspend mode of operation by connecting respective bodies thereof to respective power supply terminal.

Although the preferred embodiment has been described in detail, it should be understood that various changes, substitutions and alterations can be made therein without departing from the spirit and scope of the invention as defined by the appended claims.

What is claimed is:

1. A processing system with a suspend mode of operation to allow low power operation, the processing system operable to receive power across positive and negative terminals, comprising:
    an instruction based digital processing block;
    a clock section for generating a system clock for clocking said digital processing block;
    an internal voltage generator for decreasing the voltage across the digital processing block in a suspend mode of operation; and
    a mode controller for controlling said internal voltage generator to operate in a full power mode of operation wherein the power across said digital processing block is substantially equal to the voltage across the positive and negative terminals, and in the suspend mode of operation to reduce the voltage across said digital processing block to less than the voltage across the positive and negative terminals;
    wherein said digital processing block is disposed between internal positive and negative terminals associated with the positive and negative terminals, respectively, and at least one of said internal positive and negative terminals is isolated from the associated one of the positive and negative terminals, and wherein said internal voltage generator is disposed between said at least one of said internal positive and negative terminals for increasing the voltage difference therebetween.

2. The system of claim 1, wherein said mode controller is operable to be controlled by said digital processing block, when in the normal operating mode, to switch to the suspend mode.

3. The system of claim 1, wherein said mode controller is operable to be controlled by an externally generated signal to switch from the suspend mode to the normal operating mode.

4. The system of claim 3, wherein the processing system is contained on a integrated circuit.

5. The system of claim 1, wherein said digital processing block contains MOS transistors, wherein said at least one of said internal positive and negative terminals comprises a source terminal to which the sources of a plurality of said MOS transistors are connected, such that said internal voltage generator is operable increase the difference between said source terminal and the associated one of the positive and negative terminals during the suspend mode of operation.

6. The system of claim 5, wherein each of said MOS transistors having a source connected to said source terminal has a body connection that is connected to the one of the positive and negative terminals associated with said source terminal, such that the voltage thereon does not change during the suspend mode of operation.

7. A method for operating a processing system in a a suspend mode of operation to allow low power operation, the processing system operable to receive power across positive and negative terminals, comprising the steps of:
    executing instructions with an instruction based digital processing block;
    generating a system clock with a clock section for clocking the digital processing block;
    decreasing the voltage across the digital processing block in a suspend mode of operation with an internal voltage generator; and
    controlling the internal voltage generator with a mode controller to operate in a full power mode of operation wherein the power across the digital processing block is substantially equal to the voltage across the positive and negative terminals, and in the suspend mode of operation to reduce the voltage across the digital processing block to less than the voltage across the positive and negative terminals;
    wherein the digital processing block is disposed between internal positive and negative terminals associated with the positive and negative terminals, respectively, and at least one of the internal positive and negative terminals is isolated from the associated one of the positive and negative terminals, and wherein the internal voltage generator is disposed between the at least one of the internal positive and negative terminals for increasing the voltage difference therebetween.

8. The method of claim 7, and farther comprising the step of controlling the mode controller with the digital processing block that, when in the normal operating mode, is operable to cause the mode controller to switch to the suspend mode.

9. The method of claim 7, wherein the mode controller is operable to be controlled by an externally generated signal to switch from the suspend mode to the normal operating mode.

10. The method of claim 7, wherein the digital processing block contains MOS transistors, wherein the at least one of the internal positive and negative terminals comprises a source terminal to which the sources of a plurality of the MOS transistors are connected, such that the internal voltage generator is operable to increase the difference between the source terminal and the associated one of the positive and negative terminals during the suspend mode of operation.

11. The method of claim 10, wherein each of the MOS transistors having a source connected to the source terminal has a body connection that is connected to the one of the positive and negative terminals associated with the source terminal, such that the voltage thereon does not change during the suspend mode of operation.

* * * * *